(12) United States Patent
Kitamura et al.

(10) Patent No.: US 8,986,560 B2
(45) Date of Patent: Mar. 24, 2015

(54) METHOD FOR PRODUCING OPTICAL SEMICONDUCTOR DEVICE

(71) Applicant: Sumitomo Electric Industries, Ltd., Osaka-shi, Osaka (JP)

(72) Inventors: Takamitsu Kitamura, Fujisawa (JP); Hideki Yagi, Machida (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 14/057,146

(22) Filed: Oct. 18, 2013

(65) Prior Publication Data

US 2014/0116983 A1 May 1, 2014

(30) Foreign Application Priority Data

Oct. 31, 2012 (JP) ................................ 2012-240410

(51) Int. Cl.
  *B29D 11/00* (2006.01)
  *G02F 1/225* (2006.01)
  *G02F 1/025* (2006.01)

(52) U.S. Cl.
  CPC .............. *G02F 1/2257* (2013.01); *G02F 1/025* (2013.01)
  USPC .................. 216/24; 216/41; 216/67; 438/694; 438/712; 438/737; 257/E21.53; 257/E21.218; 257/E21.525; 257/E21.528

(58) Field of Classification Search
  CPC ..... G06F 17/5068; H01L 22/12; H01L 22/20; H01L 21/31116; H01L 33/44; G02B 2006/12142; G02F 1/01708; G02F 1/025; G02F 1/2257
  See application file for complete search history.

(56) References Cited

U.S. PATENT DOCUMENTS 8,218,591 B2 * 7/2012 Onishi et al. .................... 372/34
2008/0197377 A1 * 8/2008 Sudo et al. ....................... 257/99

OTHER PUBLICATIONS

K. Tsuzuki, et al., "40 Gbit/s n-i-n InP Mach-Zehnder modulator with a π voltage of 2.2V", Electronics Letters Online 2$^{nd}$, Oct. 2003, vol. 39, No. 20, 2 pages.

* cited by examiner

*Primary Examiner* — Lan Vinh
*Assistant Examiner* — Jiong-Ping Lu
(74) *Attorney, Agent, or Firm* — Smith, Gambrell & Russell LLP

(57) ABSTRACT

A method for producing an optical semiconductor device includes the steps of determining a wafer size to make a section arrangement including a plurality of sections in each of which the optical semiconductor device including a semiconductor mesa is formed; obtaining an in-plane distribution of a thickness of a resin layer on a wafer; obtaining a correlation between a thickness of a resin layer and a trench width; forming a trench width map using the in-plane distribution of the thickness and the correlation; preparing an epitaxial substrate by forming a stacked semiconductor layer; forming, on the epitaxial substrate, a mask based on the trench width map; forming a trench structure including the semiconductor mesa by etching the stacked semiconductor layer using the mask; forming a resin layer on the trench structure; and forming an opening on the semiconductor mesa by etching the resin layer.

14 Claims, 20 Drawing Sheets

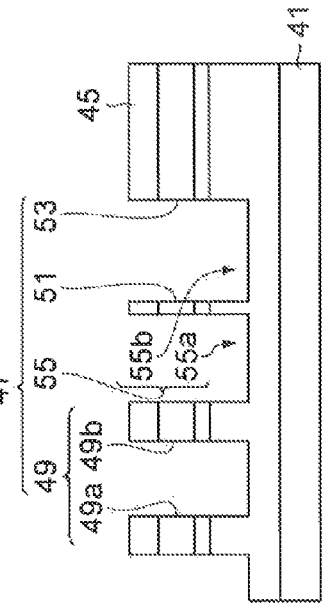
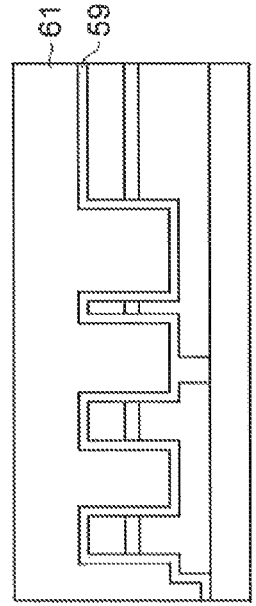
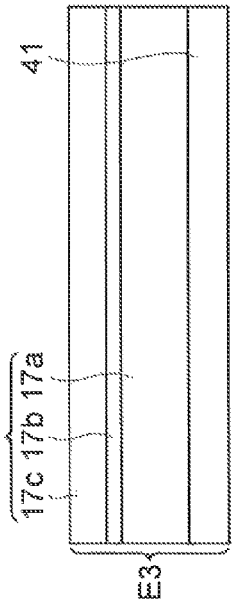
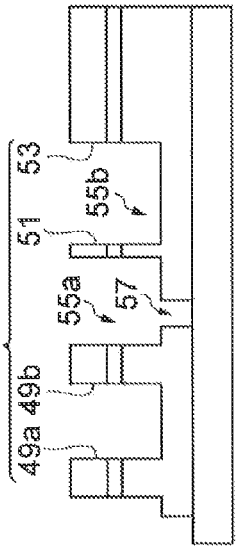
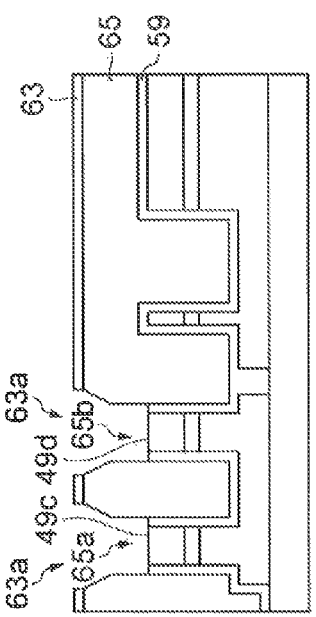

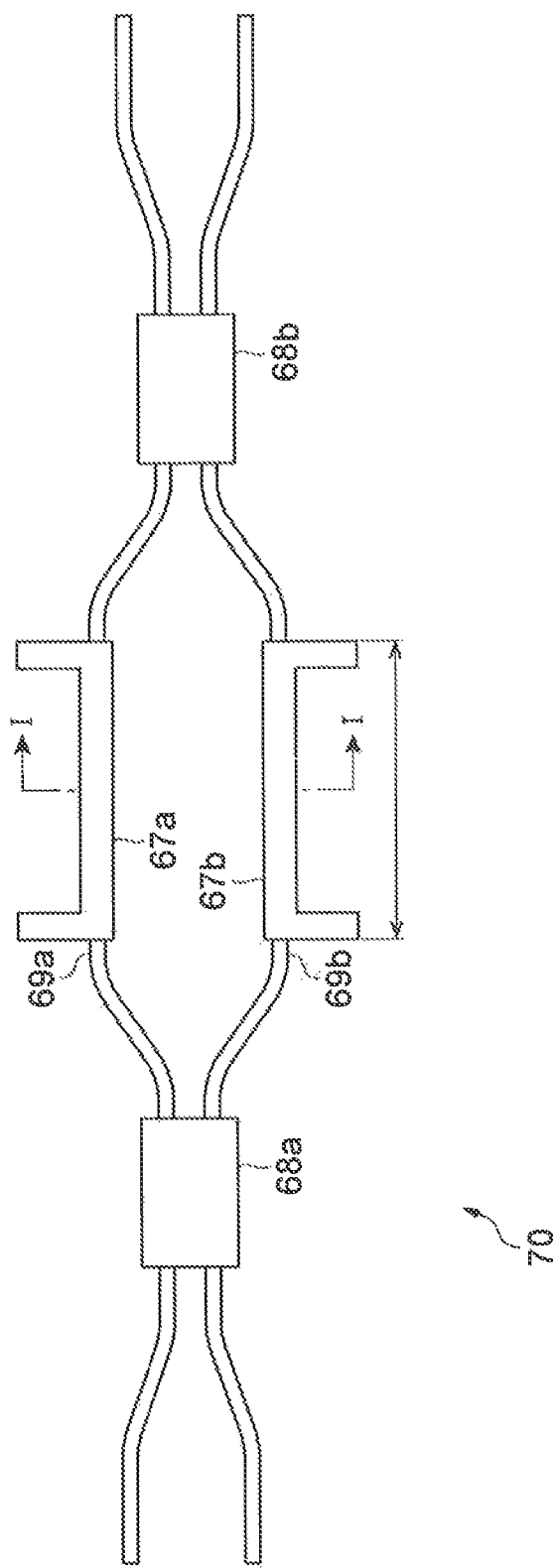

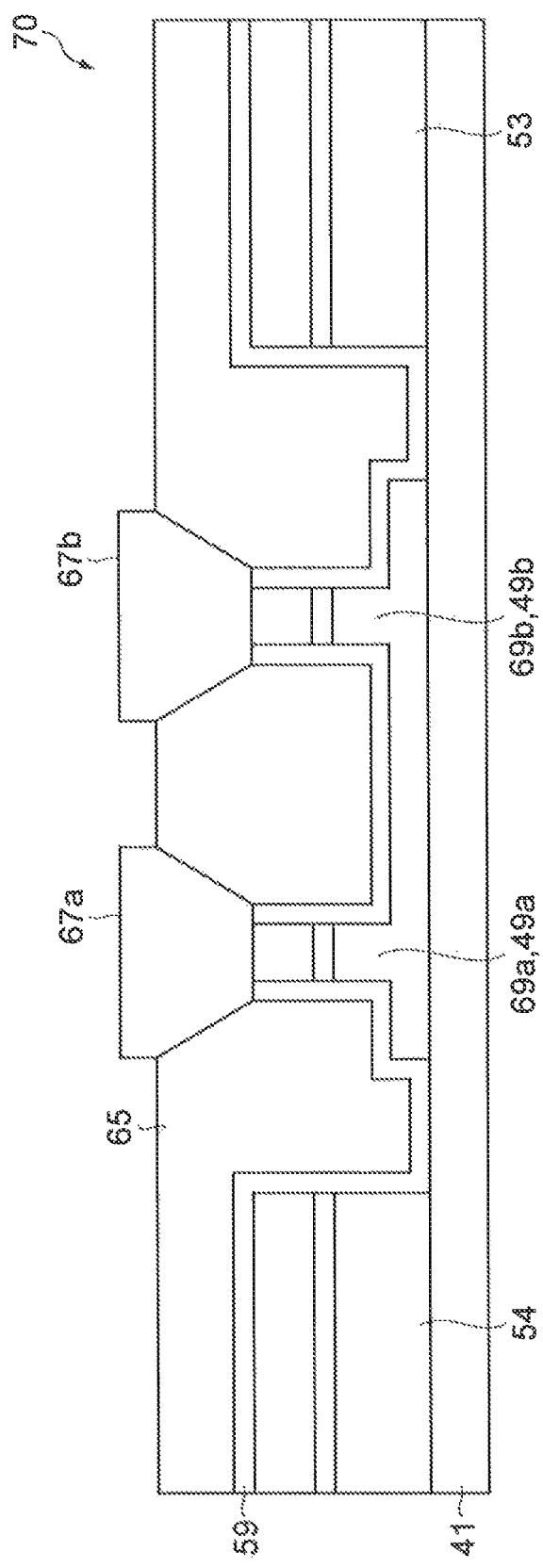

METHOD FOR PRODUCING OPTICAL SEMICONDUCTOR DEVICE

BACKGROUND OF THE INVENTION

1. Field of the Invention

The present invention relates to a method for producing an optical semiconductor device.

2. Description of the Related Art

Non-Patent Document 1 (K. Tsuzuki, T. Ishibashi, T. Ito, S. Oku, Y. Shibata, R. Iga, Y. Kondo and Y. Tohmori, 40 Gbit/s n/i/n InP Mach-Zehnder modulator with a π voltage of 2.2 V, Electronics Letters Online 2nd, Oct. 2003, Vol. 39 No. 20) describes a Mach-Zehnder modulator. The Mach-Zehnder modulator includes a high-mesa-shaped semiconductor layer disposed on a semiconductor substrate. The high-mesa-shaped semiconductor layer is buried with a protective layer. Thus, the semiconductor layer has a side surface on which the protective layer is disposed.

SUMMARY OF THE INVENTION

Semiconductor Mach-Zehnder modulators are constituted by two optical waveguides and two optical couplers for optically coupling the optical waveguides. In general, an optical waveguide is constituted by a semiconductor mesa which is buried with a resin layer. An electrode is disposed on the semiconductor mesa of a semiconductor Mach-Zehnder modulator to modulate light that propagates through the semiconductor Mach-Zehnder modulator. Furthermore, an opening is formed in the resin layer on the semiconductor mesa to electrically connect the electrode to the semiconductor mesa. Therefore, the electrode is also disposed in the opening. The optical waveguide constitutes a single-mode waveguide and thus the mesa width of the semiconductor mesa is controlled to be several micrometers or less. In an electrode forming step, an opening having a predetermined shape needs to be formed on such a narrow semiconductor mesa with high accuracy and high reproducibility. The factors that affect the variations in the shape and formation position of the opening in the electrode forming step have been studied. First, the in-plane distribution of the thickness of a resin layer and the in-plane distribution of the etching rate of the resin layer affect the variations in the shape of the opening and the like. For example, a resin is applied onto a wafer on which a semiconductor mesa has been formed. Herein, it is difficult to form a resin layer on the wafer with a uniform thickness. Therefore, the resin layer has a thickness distribution in a wafer plane. On the other hand, when an opening is formed by etching the resin layer formed on the wafer, the etching rate exhibits an in-plane distribution that is independent of the thickness distribution of the resin layer. Such in-plane distributions (the in-plane distribution of the thickness of the resin layer and the in-plane distribution of the etching rate of the resin layer) affect the variations in the shape and position of the opening.

A method for producing an optical semiconductor device according to an embodiment of the present invention includes the steps of (a) determining a wafer size to make a section arrangement including a plurality of sections in each of which the optical semiconductor device is formed, the optical semiconductor device including a trench and a semiconductor mesa defined by the trench; (b) obtaining an in-plane distribution of a thickness of a resin layer by measuring a thickness of a resin layer formed on a first arrangement structure on a wafer having the wafer size, the first arrangement structure including a plurality of mesas defined by trenches having a predetermined trench width; (c) obtaining a correlation between a thickness of a resin layer and a trench width by measuring a thickness of a resin layer formed on a second arrangement structure on a wafer having the wafer size, the second arrangement structure including a plurality of mesas defined by trenches having different trench widths from each other; (d) forming a trench width map on a wafer having the wafer size by determining a trench width of the trench in the optical semiconductor device using the in-plane distribution of the thickness and the correlation between the thickness of the resin layer and the trench width; (e) preparing an epitaxial substrate by forming a stacked semiconductor layer on a substrate having the wafer size, the substrate having the section arrangement including the plurality of sections; (f) forming, on the epitaxial substrate, a mask including a pattern of the semiconductor mesa and the trench having the trench width based on the trench width map; (g) forming a trench structure including the semiconductor mesa and the trench by etching the stacked semiconductor layer using the mask; (h) forming a resin layer on the trench structure, the resin layer being formed on an upper surface and a side surface of the semiconductor mesa; and (i) forming an opening on the semiconductor mesa by etching the resin layer, the upper surface of the semiconductor mesa being exposed through the opening.

According to the method for producing an optical semiconductor device (hereinafter referred to as "the production method"), a plurality of optical semiconductor devices having a uniform opening for forming an electrode are formed on a wafer. The optical semiconductor device includes a trench and a semiconductor mesa defined by the trench. The semiconductor mesa is buried with a resin layer. The opening is formed in the resin layer on the semiconductor mesa. The electrode is formed in the opening. The electrode is in direct contact with the top surface of the semiconductor mesa through the opening. The electrode is also formed on the resin layer.

When a resin layer is formed on a wafer, the thickness of the resin layer is not uniform in a wafer plane and the thickness distribution is generated. In particular, when the resin layer is formed on a wafer including a semiconductor mesa, the thickness distribution of the resin layer varies depending on the shape of the semiconductor mesa and the trench structure that defines the semiconductor mesa. The first arrangement structure includes a plurality of mesas defined by trenches having a predetermined trench width. By measuring the thickness of the resin layer using the first arrangement structure in accordance with the wafer size, the thickness distribution of the resin layer on the trench structure that defines the semiconductor mesa in the corresponding wafer size can be obtained.

The second arrangement structure includes a plurality of mesas defined by trenches having different trench widths from each other. According to considering a variation of the thickness of the resin layer formed on the second arrangement structure, the thickness of the resin layer varies depending on the difference in the trench width of the trench structure. Using the difference in the thickness distribution of the resin layer between the first arrangement structure and the second arrangement structure, the thickness of the resin layer can be adjusted by controlling the trench structure serving as a base on which the resin layer is to be formed. Specifically, the trench width of the trench structure is determined in each of the sections in the section arrangement of a semiconductor device using the in-plane distribution of the thickness of the resin layer formed on the first arrangement structure and the correlation between the trench width and the thickness of the resin layer formed on the second arrangement structure. Thus, a trench width map on the wafer is formed. A mask including a pattern of the semiconductor mesa and the trench having the trench width based on the trench width map is formed. A stacked semiconductor layer formed on a substrate is etched using the mask to form a trench structure including the semiconductor mesa and the trench that defines the semiconductor mesa. Thus, the trench width of the trench that defines the semiconductor mesa is changed in a plurality of sections in each of which the semiconductor device is formed. Subsequently, a resin layer is formed on the trench structure, whereby the thickness of the resin layer is adjusted in accordance with the pattern of the trench width based on the trench width map. As a result, the thickness of the resin layer is made substantially uniform in the wafer plane. When an opening is formed on the semiconductor mesa by etching the resin layer, the variation of the opening can be reduced.

The production method according to an embodiment of the present invention may further include a step of obtaining an in-plane distribution of the etching rate by measuring an etching rate of a resin layer formed on a wafer having the wafer size. In the step of forming the trench width map, the trench width of the trench in the optical semiconductor device may be determined using the in-plane distribution of the thickness, the in-plane distribution of the etching rate, and the correlation between the thickness of the resin layer and the trench width. The in-plane distribution of the etching rate in the wafer plane is independent of the thickness distribution of the resin layer. In the formation of the trench width map, the trench width of the trench in the optical semiconductor device is determined in consideration of the in-plane distribution of the etching rate in the wafer plane in addition to the in-plane distribution of the thickness of the resin and the correlation between the thickness of the resin layer and the trench width. Thus, the thickness of the resin layer formed on the trench structure can be adjusted more accurately, which can improve the uniformity of the thickness distribution of the resin. As a result, the variation of the opening can be further reduced.

In the production method according to an embodiment of the present invention, the resin layer may be composed of a benzocyclobutene (BCB) resin.

The production method according to an embodiment of the present invention may further include, after forming the trench structure and before forming the resin layer on the trench structure, a step of forming an insulating layer on the trench structure. In the step of forming the opening on the semiconductor mesa, after etching the resin layer, the insulating layer is preferably etched until the upper surface of the semiconductor mesa is exposed through the opening. The insulating layer may be composed of silicon dioxide ($SiO_2$), silicon oxynitride (SiON), or silicon nitride (SiN).

In the production method according to an embodiment of the present invention, the trench structure may include a trench defined by the semiconductor mesa and a semiconductor terrace. The trench defined by the semiconductor mesa and the semiconductor terrace may have the trench width based on the trench width map. In addition, the trench width in one of the sections in the section arrangement of the substrate may be different from the trench width in another one of the sections in the section arrangement of the substrate.

According to this production method, the adjustment of the trench width is performed on the interval between the semiconductor terrace and the semiconductor mesa. In addition, in the arrangement of sections for optical semiconductor devices arranged in the wafer plane, the trench width in one of the sections is different from the trench width in another one of the sections. This difference in the trench width can ensure high uniformity between the opening in one of the sections and the opening in another one of the sections.

In the production method according to an embodiment of the present invention, the optical semiconductor device may include a Mach-Zehnder modulator having a first waveguide including a first semiconductor mesa and a second waveguide including a second semiconductor mesa, the first and second waveguides extending in a first direction.

In the production method according to an embodiment of the present invention, the trench structure may include a first semiconductor terrace, a first trench, the first semiconductor mesa, a second trench, the second semiconductor mesa, a third trench, and a second semiconductor terrace that are arranged in that order in a second direction intersecting the first direction. The first trench may be defined by the first semiconductor terrace and the first semiconductor mesa. The third trench may be defined by the second semiconductor mesa and the second semiconductor terrace. The first and third trenches may have the trench width based on the trench width map. In addition, the trench width of the first and third trenches in one of the sections in the section arrangement of the substrate may be different from the trench width of the first and third trenches in another one of the sections in the section arrangement of the substrate.

According to this production method, the adjustment of the trench width is performed on the interval between the first semiconductor terrace and the first semiconductor mesa (trench width of the first trench) and the interval between the second semiconductor mesa and the second semiconductor terrace (trench width of the third trench).

In the production method according to an embodiment of the present invention, the mask may have a pattern for forming a dummy semiconductor mesa in the trench. The trench structure may include the dummy semiconductor mesa in the trench. The dummy semiconductor mesa may extend in a direction in which the semiconductor mesa extends. In addition, the width of the dummy semiconductor mesa may be smaller than the width of the semiconductor mesa.

According to this production method, the trench is filled with the resin. The thermal expansion coefficient of the resin is different from that of a semiconductor. Therefore, when the trench width is increased in the wafer plane, the resin layer is detached due to the difference in thermal expansion coefficient. However, by forming the dummy semiconductor mesa in the trench, the trench is constituted by a plurality of sub-trenches and the volume of the resin layer in each trench can be decreased without affecting the resin thickness adjusted in accordance with the trench width so much. This can suppress the detachment of the resin layer caused by the difference in thermal expansion coefficient.

In the production method according to an embodiment of the present invention, the dummy semiconductor mesa and the semiconductor mesa may have an interval of 3 µm or more.

In this production method, electrical coupling may be generated between the dummy semiconductor mesa and the semiconductor mesa. The electrical coupling between the dummy semiconductor mesa and the semiconductor mesa decreases the operating characteristics of an optical semiconductor device such as a Mach-Zehnder modulator. To suppress the generation of the electrical coupling, the interval between the dummy semiconductor mesa and the semiconductor mesa is preferably 3 µm or more.

In the production method according to an embodiment of the present invention, in the step of forming the mask on the epitaxial substrate, the mask may be made by performing exposure using a single photomask that includes the pattern of the semiconductor mesa and the trench having the trench width based on the trench width map.

According to this production method, the change in the trench width depending on the sections in the section arrangement of the substrate is realized by a mask pattern for exposure using a mask aligner, for example.

In the production method according to an embodiment of the present invention, in the step of forming the mask on the epitaxial substrate, the mask may be made by performing exposure using a plurality of photomasks that include the pattern of the semiconductor mesa and the trench having the trench width based on the trench width map.

According to this production method, the change in the trench width depending on the sections in the section arrangement of the substrate is realized by a pattern of reticles for exposure using a stepper, for example.

In the production method according to an embodiment of the present invention, in the step of forming the resin layer on the trench structure, a resin is preferably applied onto the trench structure by a spin coating method to form the resin layer having a predetermined thickness. The thickness of the resin layer may be adjusted while controlling a number of revolutions of a spinner during applying the resin.

The production method according to an embodiment of the present invention may further include, after forming the opening on the semiconductor mesa, a step of forming an electrode in the opening, the electrode being in contact with the upper surface of the semiconductor mesa.

BRIEF DESCRIPTION OF THE DRAWINGS

FIGS. 8A to 8E schematically show principal steps in the production method according to this embodiment.

FIG. 9 is a plan view showing a structure of the Mach-Zehnder modulator according to this embodiment.

FIG. 10 is a cross-sectional view showing arm waveguides of the Mach-Zehnder modulator according to this embodiment.

DESCRIPTION OF THE PREFERRED EMBODIMENTS

Figure 1A:
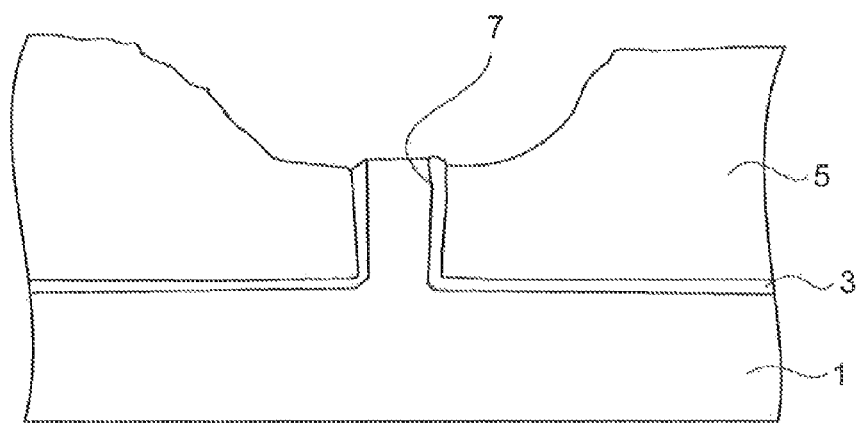
FIGS. 1A and 1B are sectional views each showing a contact opening on an optical waveguide, the sectional views describing the background of the present invention.

The findings of the present invention can be easily understood from the detailed descriptions below with reference to the attached drawings provided as examples. Subsequently, embodiments of the present invention according to a method for producing an optical semiconductor device will be described with reference to the attached drawings. If possible, the same parts are designated by the same reference numerals.

An overview of the present invention will be described with reference to FIGS. 1A, 1B, and 2. In the embodiment, a method for producing a Mach-Zehnder modulator will be described as the optical semiconductor device. The semiconductor substrate 1 has a semiconductor mesa 7 for forming an optical semiconductor device. The optical semiconductor device includes an optical waveguide having the semiconductor mesa 7. The semiconductor mesa 7 is buried with a BCB resin layer 5 made of a benzocyclobutene (BCB) resin. That is, a buried region (resin layer) made of BCB resin is formed on the semiconductor substrate 1 and on the semiconductor mesa 7. The thicknesses of the BCB resin layer 5 on a surface of the semiconductor mesa 7 and on a side surface of the semiconductor mesa 7 vary in a wafer plane depending on the base shape near the optical waveguide. When the mesa width and mesa interval of semiconductor mesas formed on a wafer are not constant, the thicknesses of the BCB resin layer also vary in a wafer plane. When the buried region is etched, the etching rate of the BCB resin layer also varies in a wafer plane. The thickness of the BCB resin layer and the etching rate of the BCB resin layer distribute in the entire wafer. A plurality of Mach-Zehnder modulators or a plurality of semiconductor mesas are formed on a single wafer. When an opening is formed in the BCB resin layer 5 on the semiconductor mesa 7 by etching in order to form an electrode on the semiconductor mesa 7, a shape of the opening of the BCB resin layer 5 varies depending on the position of the wafer plane because of the distributions of the thickness and the etching rate of the BCB resin layer 5.

Figure 1B:
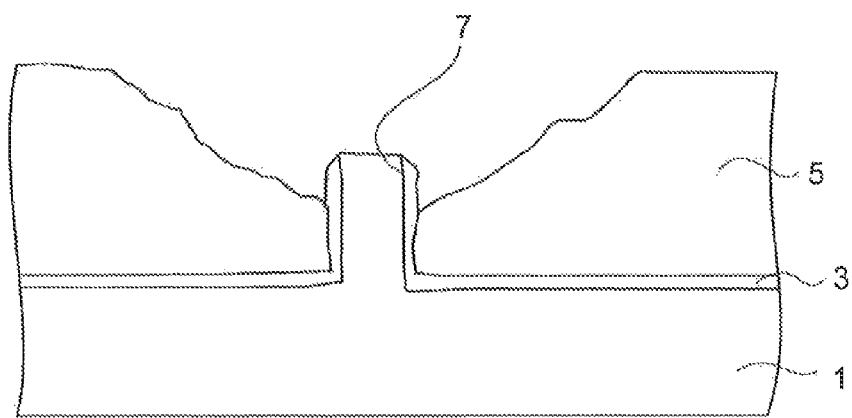

FIG. 1A schematically shows a typical shape of an opening in the central portion of a wafer when the etching rate of the BCB resin layer 5 is higher in the peripheral portion than in the central portion of the wafer. Similarly, FIG. 1B schematically shows a typical shape of an opening in the peripheral portion of a wafer when the etching rate of the BCB resin layer is higher in the peripheral portion than in the central portion of the wafer. In FIGS. 1A and 1B, the opening is formed in the BCB resin layer 5 on the semiconductor mesa 7 in a stripe shape.

FIG. 1A is a sectional view near the central portion of the wafer. The opening of the BCB resin layer 5 is formed on an upper surface of a semiconductor mesa 7 in a substantially ideal shape. Etching is stopped when a stripe-shaped opening in the central portion of the wafer is formed in the BCB resin layer 5. Therefore, the BCB resin layer 5 on the semiconductor mesa 7 in the central portion of the wafer is appropriately etched. In the central portion of the wafer, the height of the BCB resin layer 5 is substantially equal to the height of the semiconductor mesa 7. The surfaces of the buried region (BCB resin layer 5) and the semiconductor mesa 7 are substantially flat in the opening. FIG. 1B is a sectional view near the peripheral portion of the wafer. In the peripheral portion of the wafer, the height of the BCB resin layer 5 is smaller than the height of the semiconductor mesa 7 after forming the opening. A step is formed at the interface between the buried region and the semiconductor mesa 7 because the BCB resin layer 5 is excessively etched in the peripheral portion of the wafer. This excessive etching of the BCB resin layer in the peripheral portion of the wafer is due to the difference of the etching rate between the central portion and the peripheral portion of the wafer.

The thickness of the BCB resin layer 5 on the semiconductor mesa 7 also varies depending on the depth of the semiconductor mesa 7. For example, when the semiconductor mesa 7 is deep, the thickness of the BCB resin layer 5 on the semiconductor mesa 7 decreases. The thickness of the BCB resin layer 5 varies in a wafer having semiconductor mesas 7 with different mesa depths. Therefore, when openings are simultaneously formed in the BCB resin layer 5 on the semiconductor mesas 7 with different mesa depths, the BCB resin layer 5 is excessively etched in a region of the wafer where the BCB resin layer 5 on the semiconductor mesa 7 has a small thickness.

An electrode with a wider width than that of the semiconductor mesa 7 is formed on the semiconductor mesa 7. In this case, if the BCB resin layer 5 is excessively etched, a step having a difference in level is formed between the surface of the buried region and the upper surface of the semiconductor mesa. This step may cause disconnection of electrodes. Furthermore, the variation in the shape of the opening of the BCB resin layer 5 in a wafer plane may cause the variation in device characteristics. Therefore, the surface of the buried region and the upper surface of the semiconductor mesa are desirably at substantially the same level in the wafer plane. The buried region (BCB resin layer 5) and the semiconductor mesa preferably have a substantially flat surface in the opening.

Figure 2:
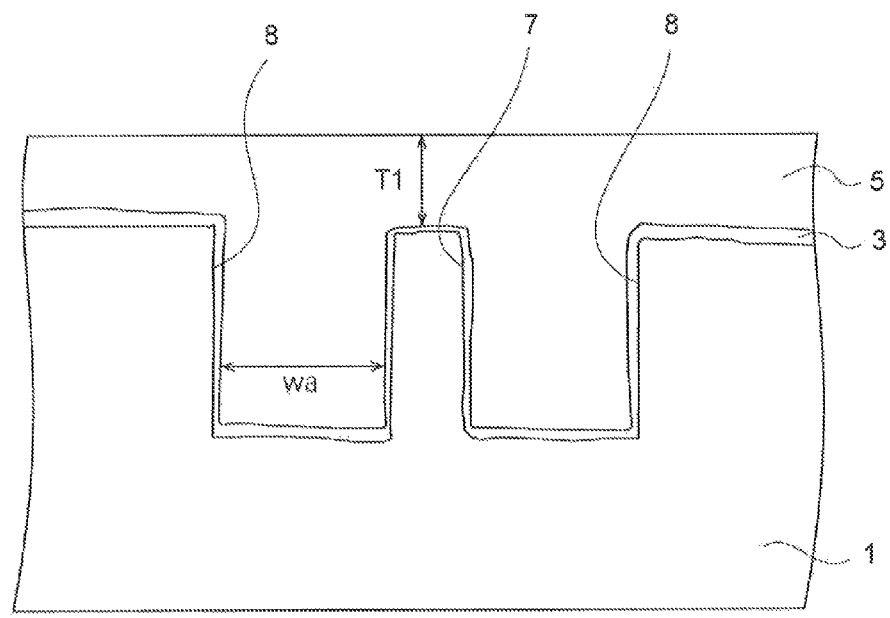
FIG. 2 is a sectional view showing a resin on an optical waveguide defined by dummy terraces, the sectional view describing the overview of the present invention.

FIG. 2 is a sectional view showing a semiconductor mesa 7 constituting an optical waveguide of an optical semiconductor device. The semiconductor mesa 7 is defined by trenches (trench grooves). Furthermore, each of the trenches is defined by the semiconductor mesa 7 and a semiconductor terrace 8. When the semiconductor mesa 7 and the semiconductor terrace 8 are buried with the BCB resin layer 5, the thickness of the BCB resin layer 5 on the semiconductor mesa 7 is not constant. For example, the thickness of the BCB resin layer 5 on the semiconductor mesa 7 varies depending on the trench width (distance between a semiconductor mesa 7 and a semiconductor terrace 8 beside the semiconductor mesa 7). In an exemplary structure, the semiconductor mesa 7 (optical waveguide) has a height of 3 μm and a width of 1.5 μm. After a trench structure including the semiconductor mesa 7 is formed by etching a stacked semiconductor layer, an insulating layer 3 (e.g., $SiO_2$) is formed over the entire wafer. Subsequently, a BCB resin layer 5 is formed so as to bury the trench structure. A small trench width increases the thickness of the BCB resin layer 5 on the semiconductor mesa 7. On the other hand, a large trench width decreases the thickness of the BCB resin layer 5 on the semiconductor mesa 7.

In the embodiment, an optical device including an optical waveguide constituted by a semiconductor mesa has various semiconductor mesa widths and trench widths. Therefore, when semiconductor mesas having different structures are buried with the BCB resin layer, it is difficult to make the thicknesses of the BCB resin layer uniform on all the semiconductor mesas.

The thicknesses of the BCB resin layer on the semiconductor mesas is controlled by using the fact that the thicknesses of the BCB resin layer on the semiconductor mesas vary depending on the interval between the semiconductor mesa and the semiconductor terrace. Specifically, the thicknesses of the BCB resin layer on the semiconductor mesas are adjusted by intentionally disposing a semiconductor terrace (hereafter referred to as "a dummy terrace") near each of the semiconductor mesas. A trench having a predetermined interval (trench width) is formed between the dummy terrace and the semiconductor mesa so as to adjust the thickness of the BCB resin layer on the semiconductor mesa. By changing the interval between the semiconductor mesa and the dummy terrace in accordance with the position of the wafer plane to obtain a desired thickness of the BCB resin layer, the thickness distribution of the BCB resin layer on the semiconductor mesas in the wafer plane can be controlled. This means that the variation in the thicknesses of the BCB resin layer on the semiconductor mesas in the wafer plane can be decreased.

When the BCB resin layer is etched using an etching apparatus such as a dry etching apparatus, the etching rate of the BCB resin layer shows an uneven distribution in the wafer plane. When the etching rate shows such an uneven distribution, the thickness of the BCB resin layer can be changed so that the difference in etching rate is compensated. In other words, the thickness of the BCB resin layer is increased or decreased so that the uneven distribution of the etching rate is compensated, whereby the variation in the opening shape of the BCB resin layer after the etching can be reduced across the wafer plane and the opening shape can be made uniform.

The use of the dummy terrace can provide the above-described technical contribution. However, when the interval between the dummy terrace and the semiconductor mesa is increased so as to obtain a desired thickness of the BCB resin layer, the volume of the BCB resin layer in the trench is also increased. This increase in the volume of the BCB resin layer may increase in the stress of the BCB resin layer. The stress may cause the BCB resin layer to be detached from the side surfaces of the dummy terrace and semiconductor mesa.

When an opening is formed in the BCB resin layer on the semiconductor mesa, a portion of the BCB resin layer near the opening may be detached due to the stress in the BCB resin layer. The detachment of the BCB resin layer makes it difficult to conduct the subsequent semiconductor processes. The detachment of the BCB resin layer also causes the disconnection of electrode wiring lines. To prevent the detachment of the BCB resin layer, a dummy semiconductor mesa can be disposed between the dummy terrace and the semiconductor mesa. However, in this structure, a wide semiconductor mesa affects the thickness of the BCB resin layer on the semiconductor mesa. To reduce this influence, the width of the dummy semiconductor mesa is desirably equal to or smaller than the width of the semiconductor mesa. Furthermore, the capacitive coupling between an optical waveguide including the additional dummy semiconductor mesa and an optical waveguide including the original semiconductor mesa may affect the device characteristics. To prevent the capacitive coupling, the dummy semiconductor mesa is preferably disposed apart from the semiconductor mesa at intervals of 3 µm or more. The dummy semiconductor mesa is formed, but is not used as an optical waveguide. Therefore, for example, the dummy semiconductor mesa need not include a cladding layer and a core layer that are essential layers in the semiconductor mesa. However, in this embodiment, the dummy semiconductor mesa is also formed using an epitaxial structure for forming a semiconductor mesa, and thus the dummy semiconductor mesa has an optical waveguide structure.

Figure 3:
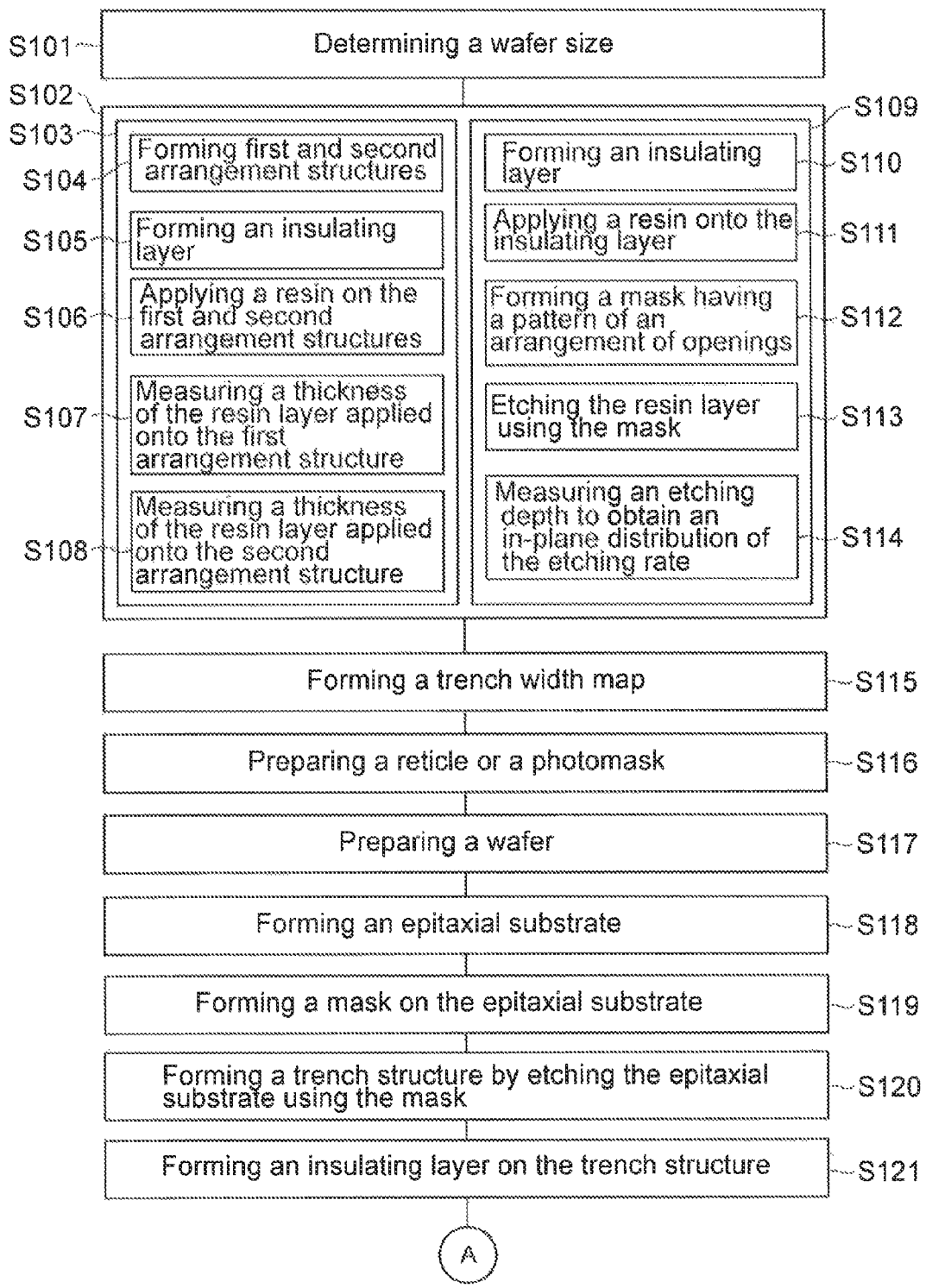
FIG. 3 is a flowchart showing principal steps in a method for producing a Mach-Zehnder modulator according to this embodiment.
Figure 4:
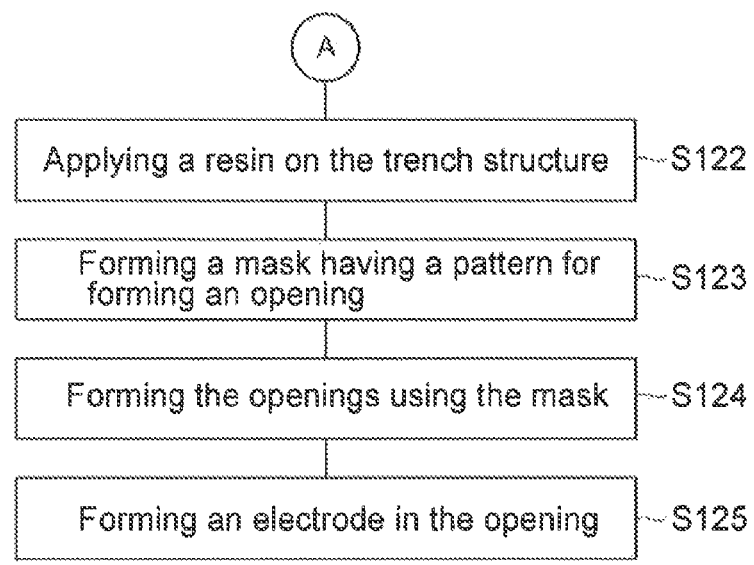
FIG. 4 is a flowchart showing principal steps in the method for producing a Mach-Zehnder modulator according to this embodiment.

An embodiment will be described in detail. FIGS. 3 and 4 are flowcharts showing principal steps in a method for producing an optical semiconductor device according to this embodiment. Hereafter, as an optical semiconductor device produced by the production method according to this embodiment, a Mach-Zehnder modulator will be described.

Figure 5:
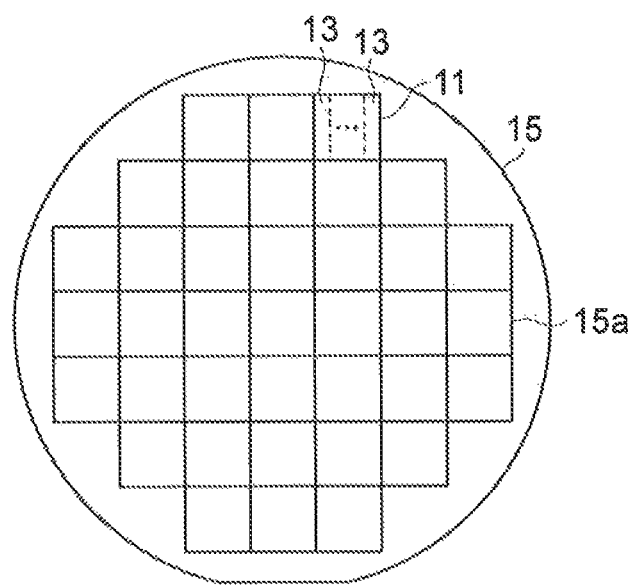
FIG. 5 shows an example of a shot map according to this embodiment.

In step S101, as shown in FIG. 3, a wafer size is determined to make a section arrangement including a plurality of sections in each of which an optical semiconductor device (semiconductor chip) including the Mach-Zehnder modulator is formed. FIG. 5 shows shots for exposure and a section arrangement including a plurality of sections in each of which an optical semiconductor device is formed. In FIG. 5, a wafer 15 is illustrated. A map of shots 11 for exposure is shown on a main surface 15a of the wafer 15. For example, each of the shots 11 corresponds to a unit of exposure in the case where reduced projection exposure is used in photolithography. Each of the shots 11 includes a plurality of sections 13 in each of which an optical semiconductor device is formed. That is, the shot 11 includes a plurality of sections 13 corresponding to a plurality of optical semiconductor devices (semiconductor chips). The shot 11 may be constituted by a single section or a plurality of sections. By determining the wafer size, a section arrangement including the plurality of sections 13 can be determined on the main surface 15a of the wafer 15.

In step S102, a measurement for forming a trench width map is performed. Some wafers having the determined wafer size are prepared. The wafers are, for example, semi-insulating InP wafers.

Figure 6A:
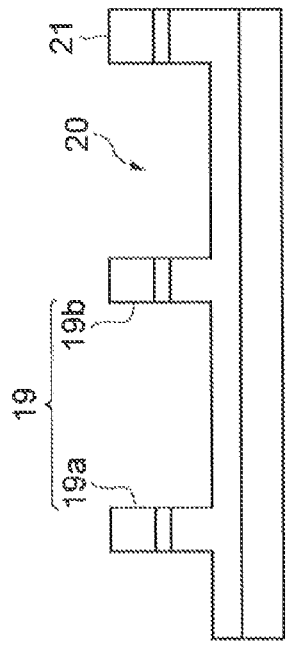
FIGS. 6A to 6D schematically show principal steps in a production method according to this embodiment.

In step S103, a thickness of a resin that buries a trench structure is measured to obtain a relationship between the trench structure and the thickness of the resin. The trench structure includes an arrangement of a trench that defines a semiconductor mesa. Herein, the semiconductor mesa constitutes an arm waveguide of the Mach-Zehnder modulator. As shown in FIG. 6A, a first cladding layer 17a, a core layer 17b, and a second cladding layer 17c are sequentially grown on a wafer 15 prepared for this measurement to make an epitaxial substrate E1. The first cladding layer 17a, the core layer 17b, and the second cladding layer 17c constitute a stacked semiconductor layer 17. The epitaxial substrate E1 includes the wafer 15 and the stacked semiconductor layer 17 grown on the wafer 15.

Figure 6B:
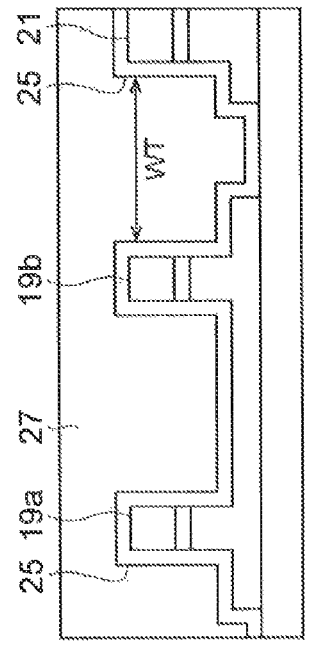
Figure 6C:
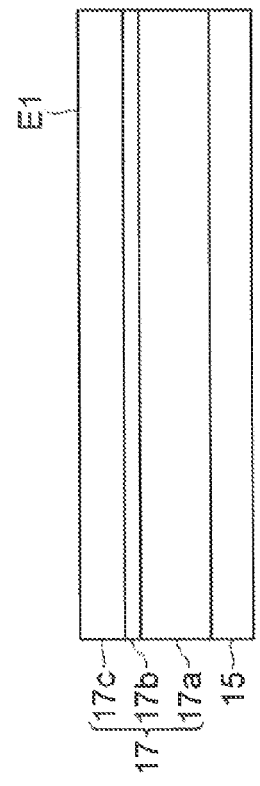

In step S104, a first arrangement structure and a second arrangement structure are formed on the epitaxial substrate E1. The first arrangement structure includes a plurality of semiconductor mesas which are defined by trenches having a predetermined trench width (constant trench width). On the other hand, the second arrangement structure includes a plurality of semiconductor mesas which are defined by trenches having different trench widths from each other. Each of the semiconductor mesas in the first arrangement structure and the second arrangement structure constitutes an optical waveguide. As shown in FIG. 6B, semiconductor mesas 19a and 19b, a trench 20, and a dummy terrace 21 are formed using a photolithography method. As shown in FIG. 6C, a first cladding layer is then removed to isolate an element region 23a of the semiconductor mesas 19a and 19b from a dummy region 23b of the dummy terrace 21. Thus, an element isolation region 23c is formed and element isolation is achieved. The element isolation region 23c is formed using a photolithography method.

The first arrangement structure is disposed over the entire main surface 15a of the wafer 15 so that each of the sections 13 includes the semiconductor mesa that is defined by the trench having the same width. With this first arrangement structure, the in-plane distribution of the thickness of a resin layer on a base structure including the trench and semiconductor mesa can be measured. The second arrangement structure is disposed over the entire main surface 15a of the wafer 15 so that the plurality of sections 13 include the semiconductor mesas that are defined by the trenches having different width. With this second arrangement structure, the correlation between the thickness of the resin layer and the trench width can be measured.

Figure 6D:
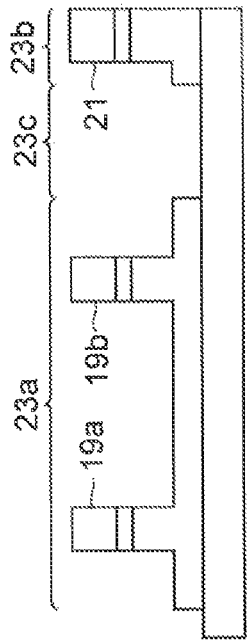

In step S105, as shown in FIG. 6D, an insulating layer 25 is formed so as to cover the first arrangement structure and second arrangement structure including the semiconductor mesa and dummy terrace. The insulating layer 25 is composed of, for example, $SiO_2$. After the formation of the insulating layer 25, in step S106, a resin is applied so as to bury the first arrangement structure and second arrangement structure. Thus, a resin layer 27 is formed. The applied resin is, for example, a benzocyclobutene (BCB) resin.

In step S107, the thickness of the resin layer 27 applied onto the first arrangement structure on the wafer 15 having the determined wafer size is measured to obtain the in-plane distribution of the thickness. In this measurement, the in-plane distribution of the thickness of the resin formed on a base structure including the dummy terrace, trench, and semiconductor mesa is measured across the entire main surface 15a of the wafer 15. With the first arrangement structure, the in-plane distribution of the thickness of a resin that covers a base structure including an arrangement of a semiconductor mesa can be obtained.

In step S108, the thickness of the resin layer 27 applied onto the second arrangement structure on the wafer 15 having the determined wafer size is measured to obtain the correlation between the thickness of the resin layer 27 and the trench width WT. With the second arrangement structure, the distribution of the thickness of the resin on the semiconductor mesas defined by a plurality of trenches having different trench widths WT can be measured. As a result of this measurement, the correlation between the trench width and the resin thickness can be obtained.

Figure 7A:
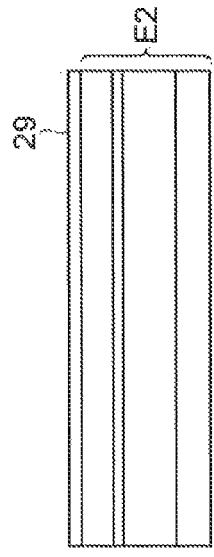
FIGS. 7A to 7E schematically show principal steps in the production method according to this embodiment.

In step S109, the etching rate of the resin layer 27 on a wafer having the determined wafer size is measured to obtain the in-plane distribution of the etching rate. Another wafer (referred to as "a wafer 15") is prepared for this measurement. As shown in FIG. 7A, a first cladding layer 17a, a core layer 17b, and a second cladding layer 17c are sequentially grown on the wafer 15 to make an epitaxial substrate E2 having the same structure as the epitaxial substrate E1. The first cladding layer 17a, the core layer 17b, and the second cladding layer 17c constitute a stacked semiconductor layer 17. The epitaxial substrate E2 includes the wafer 15 and the stacked semiconductor layer 17 grown on the wafer 15.

Figure 7B:
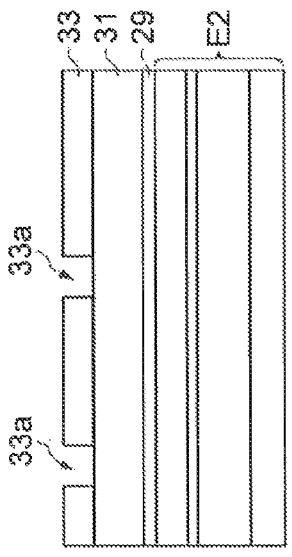

In step S110, as shown in FIG. 7B, an insulating layer 29 is formed on a flat surface of the epitaxial substrate E2 without forming a base structure. The insulating layer 29 is composed of, for example, $SiO_2$. After the formation of the insulating layer 29, in step S111, a resin is applied onto the insulating layer 29 formed on the flat surface of the epitaxial substrate E2 to form a resin layer 31. The applied resin is, for example, a benzocyclobutene (BCB) resin.

In step S112, a mask 33 is formed on the resin layer 31. The mask 33 defines the arrangement of openings for forming electrodes to be disposed on the resin layer. The mask 33 may be a resist mask. The mask 33 has a pattern of an arrangement of openings 33a.

In step S113, the resin layer 31 is etched using the mask 33. Then, the pattern of the arrangement of openings 33a of the mask 33 is transferred to the resin layer 31. Openings are formed in the resin layer 31. In the openings of the resin layer 31, recesses each having a depth based on the distribution of the etching rate in the wafer plane are formed.

In step S114, the depth of the arrangement of the recesses 31b in the etched resin layer 31a is measured to obtain the in-plane distribution of the recess depth. The in-plane distribution of the etching rate can be calculated from the in-plane distribution of the recess depth. The in-plane distribution of the recess depth is believed to be substantially equal to the in-plane distribution of the etching rate.

In step S115, a trench width that defines a semiconductor mesa is determined in each of the sections in the section arrangement using the in-plane distribution of the thickness obtained in step 107, the correlation obtained in step S108, and the in-plane distribution of the etching rate obtained in step S114. Thus, a trench width map on the device wafer is formed. The use of the trench width map can improve the uniformity of contact openings for arm waveguides of the Mach-Zehnder modulator.

In step S116, a photomask (reticle) for reduced projection exposure or a photomask for mask aligners is prepared to use the trench width map.

In a step of forming a trench structure (trench structure 47) that defines the semiconductor mesa of the Mach-Zehnder modulator, a mask is formed on the epitaxial substrate using a single photomask that defines different trench widths. The photomask has a mask pattern based on the trench width map. In the sections of a device wafer, different trench widths are distributed by the following method. For example, a photomask for exposure on which a pattern that defines different trench widths has been formed in advance is prepared. The pattern formed on the photomask for exposure is then transferred onto a resist formed on the epitaxial substrate using a mask aligner.

Alternatively, when a trench structure (trench structure 47) that defines the semiconductor mesa of the Mach-Zehnder modulator is formed, a mask may be formed on the epitaxial substrate using a plurality of photomasks (reticles) that define different trench widths. The photomasks (reticles) have mask patterns based on the trench width map. The trench widths are changed in the sections of a device wafer by the following method. For example, a plurality of reticles are prepared. Each of the reticles has a predetermined pattern that defines a trench width and the trench width of one of the reticles is different from the trench width of other reticles. The pattern formed on the plurality of reticles is transferred onto a resist formed on the epitaxial substrate using a step-and-repeat exposure method.

In step S117, a device wafer 41 having the determined wafer size is prepared. In step S118, as shown in FIG. 8A, a first cladding layer 17a, a core layer 17b, and a second cladding layer 17c are sequentially grown on the device wafer 41 to make an epitaxial substrate E3. The first cladding layer 17a, the core layer 17b, and the second cladding layer 17c constitute a stacked semiconductor layer 43. The epitaxial substrate E3 includes the device substrate (wafer) 41 and the stacked semiconductor layer 43 grown on the device wafer 41. The stacked semiconductor layer 43 constitutes an optical waveguide structure.

In step S119, as shown in FIG. 8B, a mask 45 having a pattern for forming semiconductor mesas and a dummy terrace is formed on the epitaxial substrate E3. The mask 45 has a pattern of the trench width based on the trench width map and is formed on the stacked semiconductor layer 43 of the epitaxial substrate E3. In step S120, as shown in FIG. 8B, the stacked semiconductor layer 43 of the epitaxial substrate E3 is etched using the mask 45 to form a trench structure 47. The trench structure 47 includes a semiconductor mesa 49 including semiconductor mesas 49a and 49b, a dummy terrace 53, and a trench 55. In the embodiment, the semiconductor mesas 49a and 49b serve as one of a semiconductor mesa, a first semiconductor mesa, or a second semiconductor mesa. The dummy terrace 53 serves as one of a semiconductor terrace, a first semiconductor terrace, or a second semiconductor terrace. The trench 55 serves as one of a trench, a first trench, or a third trench. The trench 55 further includes trenches 55a and 55b. In FIG. 8B, only the trench 55 and dummy terrace 53 disposed on the semiconductor mesa 49b side are shown, but the same structure is also disposed on the semiconductor mesa 49a side. The trench 55 defines the semiconductor mesa 49. The trench structure 47 has the distribution of trench widths based on the trench width map. The mask 45 is removed after the etching. The trench structure 47 can include a dummy semiconductor mesa 51. The dummy semiconductor mesa 51 is disposed in the trench 55 between the semiconductor mesa 49b and the dummy terrace 53. The dummy semiconductor mesa 51 divides the trench 55 into the trenches 55a and 55b. When necessary, as shown in FIG. 8C, a mask for element isolation is formed and etching is performed using the mask. An element isolation groove 57 is formed in the trench 55 (trench 55a) to electrically isolate the semiconductor mesa 49 from the dummy terrace 53.

As a result of step S120, the trench structure 47 is formed by etching the stacked semiconductor layer 43 using the mask 45. The trench structure 47 includes the arrangement of the trench 55 that defines the semiconductor mesas 49a and 49b constituting arm waveguides of the Mach-Zehnder modulator.

In step S121, as shown in FIG. 8D, an insulating layer 59 is formed on the trench structure 47. The insulating layer 59 is made of, for example, silicon dioxide ($SiO_2$), silicon oxynitride (SiON), or silicon nitride (SiN). As a result of step S121, the insulating layer 59 is formed on the trench structure 47 after the trench structure 47 is formed and before a resin is applied onto the trench structure 47.

In step S122, as shown in FIG. 8D, a resin is applied so as to cover the insulating layer 59 on the trench structure 47 based on the trench width map. Thus, a resin layer 61 is formed. The resin layer 61 is formed on upper surfaces of the semiconductor mesas 49a and 49b, and side surfaces of the semiconductor mesas 49a and 49b. The trench 55 (trenches 55a and 55b) is filled with the resin layer 61. The thickness of the resin layer 61 has an in-plane distribution according to the trench width based on the trench width map. The in-plane distribution allows the formation of openings on the semiconductor mesas in a desired shape. As a result of step S122, the trench structure 47 is buried with the resin layer 61.

As shown in FIG. 8B, the mask 45 may have a pattern for forming the dummy semiconductor mesa 51 in the trench. Herein, the trench structure 47 includes the dummy semiconductor mesa 51 in the trench 55. The dummy semiconductor mesa 51 extends in parallel with the semiconductor mesas 49a and 49b. In this embodiment, the width of the dummy semiconductor mesa 51 is smaller than those of the semiconductor mesas 49a and 49b. The resin is applied on the trench structure 47. Then, the trench is filled with the resin layer 61. The thermal expansion coefficient of the resin layer 61 is different from that of a semiconductor. Therefore, when the trench width is increased, the resin layer 61 may be detached due to the difference in thermal expansion coefficient. However, by extending the dummy semiconductor mesa 51 in the trench, the volume of the resin layer in the trench can be subdivided. Therefore, the detachment of the resin layer 61 caused by the difference in thermal expansion coefficient can be suppressed. In this case, the dummy semiconductor mesa 51 does not affect the thickness of the resin layer adjusted in accordance with the trench width. The interval between the dummy semiconductor mesa 51 and the semiconductor mesa 49b is 3 μm or more. The electrical coupling between the dummy semiconductor mesa 51 and the semiconductor mesa 49b may degrade the operation characteristics of the Mach-Zehnder modulator. To reduce the electrical and optical coupling, the interval between the dummy semiconductor mesa 51 and the semiconductor mesa 49b is preferably set to be 3 μm or more.

In step S123, as shown in FIG. 8E, a mask 63 is formed on the resin layer 61. The mask 63 has a pattern for forming openings 63a located on the semiconductor mesas 49a and 49b. The openings 63a are made to form openings for forming electrodes.

In step S124, as shown in FIG. 8E, the resin layer 61 is etched using the mask 63 to form an etched resin layer 65. The etched resin layer 65 has openings 65a and 65b, which are located on the semiconductor mesas 49a and 49b, respectively. Furthermore, portions of the insulating layer 59 on the semiconductor mesas 49a and 49b are removed by etching to expose upper surfaces 49c and 49d of the semiconductor mesas 49a and 49b. As a result of step S124, the arrangement of the openings 65a and 65b for the semiconductor mesas 49a and 49b is formed by etching the resin layer 61 of the trench structure 47. As a result of step S124, the resin is etched and then the insulating layer 59 is etched to partly expose the surfaces of the semiconductor mesas 49a and 49b.

In step S125, as shown in FIG. 9, electrodes 67a and 67b are formed on the etched resin layer 65. The electrodes 67a and 67b are formed in the openings 65a and 65b for the semiconductor mesas 49a and 49b, respectively. The electrodes 67a and 67b are respectively in contact with the upper surfaces 49c and 49d of the semiconductor mesas 49a and 49b through the openings 65a and 65b located on the semiconductor mesas 49a and 49b. Thus, a Mach-Zehnder modulator 70 shown in FIG. 9 is produced.

The method for producing the Mach-Zehnder modulator 70 can ensure the uniformity of the openings for forming electrodes electrically connected to arm waveguides 69a and 69b of the Mach-Zehnder modulator 70. The Mach-Zehnder modulator 70 includes an optical coupler (e.g., multimode interference (MMI) coupler) 68a connected to one ends of the arm waveguide 69a and 69b and an optical coupler (e.g., MMI coupler) 68b connected to the other ends of the arm waveguide 69a and 69b.

As described above, when the resin layer 61 is formed on the wafer 15, a nonuniform thickness distribution of the resin layer is formed. On the other hand, the etching rate in the wafer plane exhibits an in-plane distribution that is independent of the above thickness distribution of the resin layer.

In addition to these in-plane distributions, the thickness of the resin layer varies depending on the difference in the trench width of the trench structure buried with the resin layer. With the second arrangement structure, the correlation between the trench width and the thickness of the resin layer is obtained. With the first arrangement structure, the thickness distribution of the resin layer on the trench structure having the constant trench width is obtained. In consideration of the difference in the thickness distribution of the resin layer between the first arrangement structure and the second arrangement structure, the adjustment amount of the thickness of the resin layer can be estimated using the base structures. By taking into consideration the in-plane distribution of the etching rate in the wafer plane in addition to the adjustment amount, the variation of the openings for forming electrodes can be reduced. The adjustment amount can be changed so as to compensate for the in-plane distribution of the etching rate.

Specifically, when the section arrangement including a plurality of sections in each of which an optical semiconductor device including the Mach-Zehnder modulator 70 is formed is defined in the wafer plane, the variation of the openings for forming electrodes can be reduced by changing the trench width of the trench structure that defines a semiconductor mesa in the sections in the section arrangement on the basis of the findings from the second arrangement structure.

FIG. 10 is a sectional view taken along line I-I of FIG. 9. Referring to FIG. 10, the trench structure 47 includes a first semiconductor terrace 53, a semiconductor mesa 49a serving as one of a pair of arm waveguides 69a and 69b of the Mach-Zehnder modulator, a semiconductor mesa 49b serving as the other of the pair of arm waveguides 69a and 69b, and a second semiconductor terrace 54. The second semiconductor terrace 54, the semiconductor mesa 49a, the semiconductor mesa 49b, and the first semiconductor terrace 53 are arrange in that order in a direction intersecting the direction in which the arm waveguides 69a and 69b of the Mach-Zehnder modulator 70 extend. The interval between the first semiconductor terrace 53 and the semiconductor mesa 49b is equal to the trench width based on the trench width map. The interval between the second semiconductor terrace 54 and the semiconductor mesa 49a is equal to the trench width based on the trench width map. The adjustment of the trench width is performed on the interval between the first semiconductor terrace 53 and the semiconductor mesa 49b and the interval between the second semiconductor terrace 54 and the semiconductor mesa 49a.

The adjustment of the trench width is performed across the entire wafer. Therefore, in one section of the section arrangement of the device wafer 41, the interval between the first semiconductor terrace 53 and the semiconductor mesa 49b is equal to a first trench width. In another section of the section arrangement of the device wafer 41, the interval between the first semiconductor terrace 53 and the semiconductor mesa 49b is equal to a second trench width. Herein, the first trench width is different from the second trench width. According to this production method, the trench width in one of the sections for forming optical semiconductor devices (chips), the sections being arranged in the wafer plane, is different from the trench width in another one of the sections. This difference can provide high uniformity between the openings for forming electrodes in the one section and the openings for forming electrodes in the other section.

EXAMPLE

A method for designing a mask whose trench width is corrected to make the opening shape of a BCB resin layer uniform in a wafer plane will be described. In this Example, the exposure that uses a stepper will be described. The description can also be applied to the exposure that uses a mask aligner.

To obtain the relationship between the trench width and the thickness of the BCB resin layer on a semiconductor mesa, the height of the semiconductor mesa, the width of the semiconductor mesa, and the thickness of the BCB resin layer on the semiconductor mesa are determined. One example is shown below.

Height of semiconductor mesa: 3 µm
Depth of isolation mesa: 0.8 µm
Width of semiconductor mesa: 1.5 µm
Thickness of BCB resin layer on semiconductor mesa: 3 µm
The used reticle has two types of patterns. A single reticle has a pattern in which the trench width beside the semiconductor mesa is fixed to measure the thickness distribution of the BCB resin layer in the wafer plane (e.g., the trench width is 130 µm). The reticle also has a pattern in which the trench width is gradually changed in a discrete manner to measure the relationship between the trench width and the thickness of the BCB resin layer on the semiconductor mesa (e.g., a pattern in which the trench width is changed from 20 µm to 240 µm at an increasing rate of 20 µm). The two types of patterns may be formed in different reticles, but may be formed in one reticle for convenience sake.

Two wafers (semiconductor substrates) are then prepared. A first cladding layer, a core layer, and a second cladding layer are grown in that order on each of the semiconductor substrates by a metal-organic vapor phase epitaxy (MOVPE) method to prepare an epitaxial substrate (e.g., refer to FIG. 6A). Each of the semiconductor substrates is composed of a semi-insulating group III-V compound semiconductor such as Fe-doped InP. The first cladding layer is composed of a group III-V compound semiconductor such as InP. The core layer is composed of a group III-V compound semiconductor such as AlGaInAs. The second cladding layer is composed of a group III-V compound semiconductor such as InP.

Figure 11:
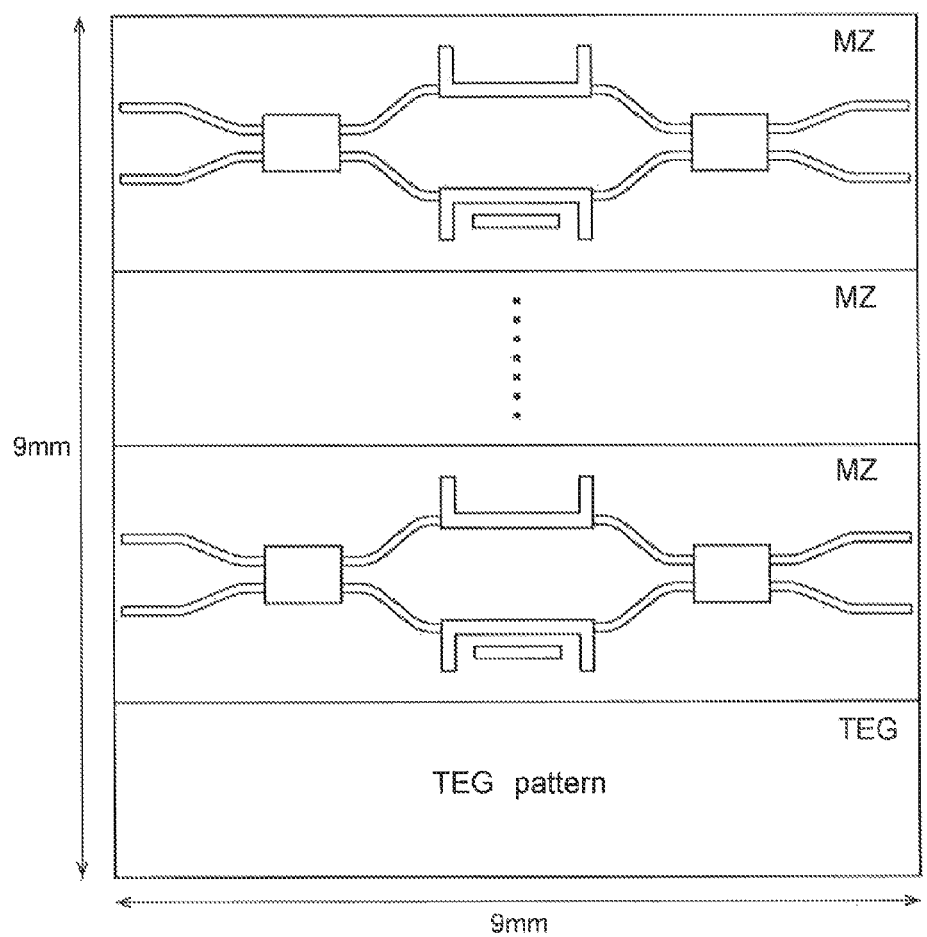
FIG. 11 shows a reticle including a section MZ of a semiconductor chip for the Mach-Zehnder modulator and a section TEG of a test element group chip in a shot-size area.
Figure 12A:
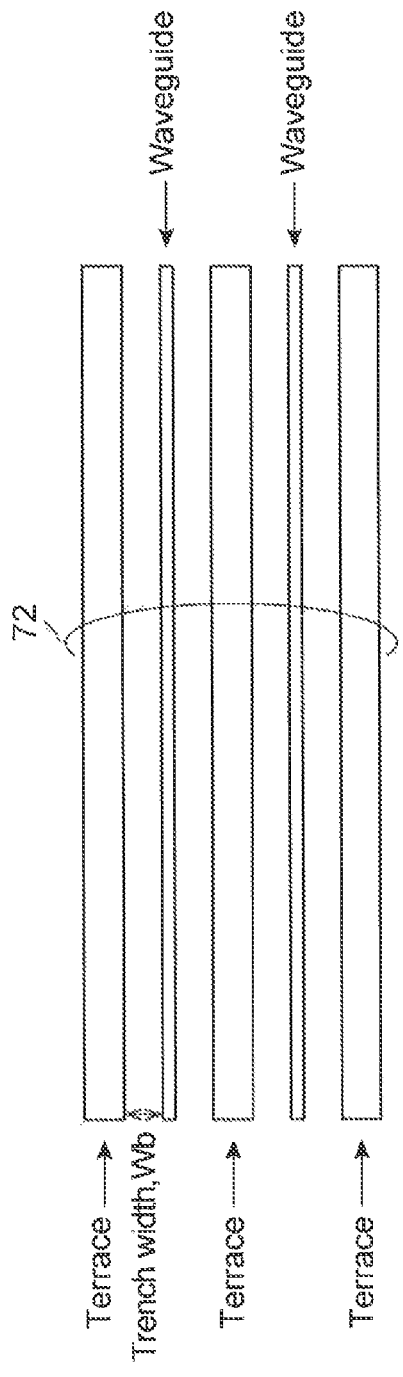
FIGS. 12A and 12B show TEG patterns for forming a first arrangement structure and a second arrangement structure, respectively.
Figure 12B:
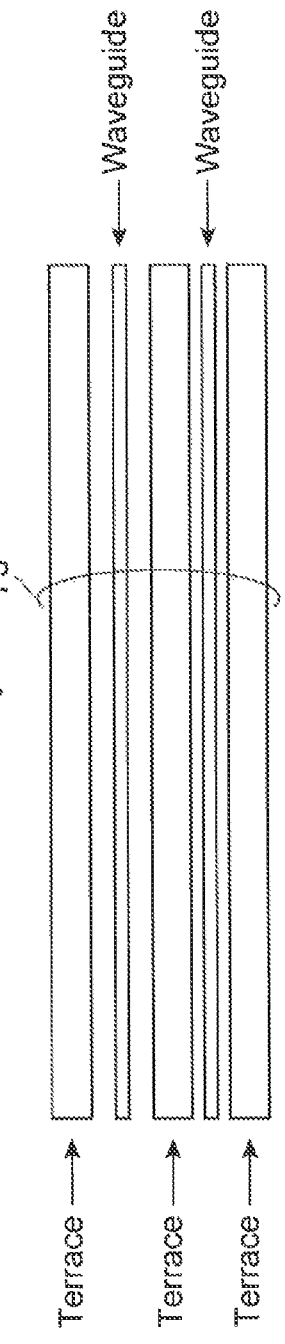

First, one of the two epitaxial substrates is processed to form a waveguide (e.g., refer to FIG. 6B). After the epitaxial growth process, an insulating layer composed of SiN is deposited on the second cladding layer to form an insulating layer mask. A resist mask having a pattern for forming a waveguide is then formed. The insulating layer is formed by, for example, a chemical vapor deposition (CVD) method. The resist mask is formed by forming a resist layer on the entire surface of the insulating layer by a spin coating method or the like and then patterning the resist layer by photolithography. Herein, the reticle for exposure has a pattern in which the trench width is not corrected. In this Example, the shot size is 9 mm×9 mm and the shot map shown in FIG. 5 is used on a 3-inch wafer. As shown in FIG. 11, the reticle includes a section MZ of a semiconductor chip for the Mach-Zehnder modulator and a section TEG of a test element group chip in an area having a shot size of 9 mm×9 mm. The section TEG has two types of patterns. As shown in FIG. 12A, a first pattern 72 for the first arrangement structure defines semiconductor mesas and semiconductor terraces with a constant trench width. The first pattern 72 includes an alternate arrangement in which semiconductor mesas and semiconductor terraces are alternately arranged with a constant interval (trench width) between the semiconductor mesas and the semiconductor terraces. The first pattern 72 is, for example, used to form the first arrangement structure including semiconductor mesas constituting waveguides, the semiconductor mesas being defined by a trench having a predetermined trench width (constant trench width). As shown in FIG. 12B, a second pattern 73 for the second arrangement structure defines semiconductor mesas (waveguides) and semiconductor terraces with different trench widths. The second pattern 73 includes another alternate arrangement in which semiconductor mesas and semiconductor terraces are alternately arranged with intervals (trench widths) gradually changed between the semiconductor mesas and the semiconductor terraces. The second pattern 73 is, for example, used to form the second arrangement structure including semiconductor mesas constituting waveguides, the semiconductor mesas being defined by trenches having different trench widths.

Subsequently, the insulating layer is etched by, for example, a reactive ion etching (RIE) method using an etching gas containing $CF_4$ gas to transfer the pattern of the resist mask onto the insulating layer. Thus, an insulating layer mask is formed. The resist mask is then removed by performing, for example, an ashing process that uses $O_2$ gas or a dissolution treatment that uses an organic solvent.

The second cladding layer, the core layer, and part of the first cladding layer are etched by, for example, a reactive ion etching method using the insulating layer mask as an etching mask. After the etching process, the insulating layer mask is removed using a buffered hydrofluoric acid. Through this process, a semiconductor mesa is formed.

Subsequently, part of the exposed first cladding layer is etched until at least the substrate is exposed to form an element isolation mesa (e.g., refer to FIG. 6C). To achieve this, first, an insulating layer composed of SiN is deposited on a substrate product in which a waveguide has been formed and a resist mask is formed on the insulating layer. The insulating layer is then etched by a reactive ion etching method using the resist mask to transfer the resist pattern onto the insulating layer. In the reactive ion etching, for example, an etching gas containing $CF_4$ gas can be used. The resist mask is then removed by, for example, an ashing process that uses $O_2$ gas or a dissolution treatment that uses an organic solvent.

Part of the first cladding layer and substrate is then etched by, for example, a reactive ion etching method using the patterned insulating layer as a mask. The insulating layer used as the mask is then removed using a buffered hydrofluoric acid. Thus, an element isolation mesa is formed.

Subsequently, a protective layer composed of $SiO_2$ is formed on the element isolation mesa and the entire surface of the exposed semiconductor of the semiconductor mesa (refer to FIG. 6D). The protective layer is formed by, for example, a chemical vapor deposition (CVD) method. The thickness of the protective layer is, for example, 200 nm to 400 nm.

A resin layer composed of a benzocyclobutene (BCB) resin is formed on the entire surface of the protective layer that covers the element isolation mesa and semiconductor mesa by, for example, a spin coating method. The resin layer is formed so as to cover the element isolation mesa and the semiconductor mesa and have a flat surface (refer to FIG. 6D). The thickness of the BCB resin layer on the semiconductor mesa is, for example, 1.5 µm to 4.5 µm. In this Example, the thickness of the BCB resin layer on the semiconductor mesa is about 3 µm. Thus, a substrate product is produced.

Figure 13:
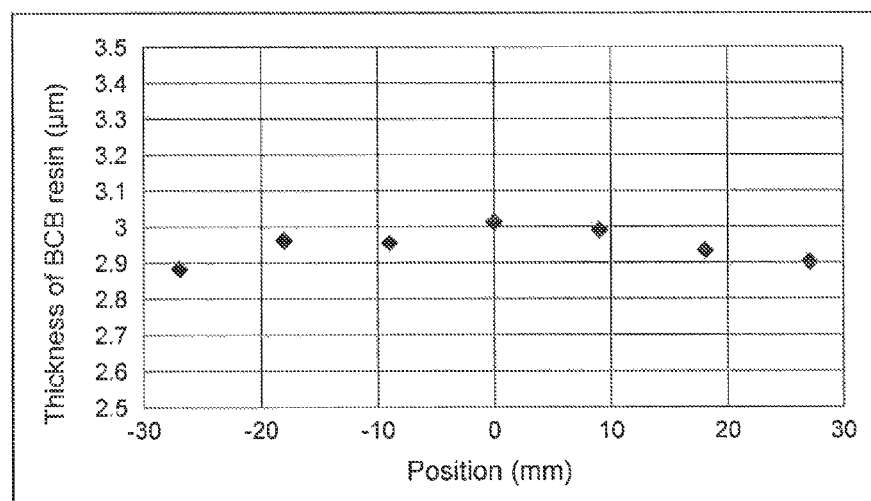
FIG. 13 shows the in-plane distribution of the thickness of a BCB resin layer on a semiconductor mesa.
Figure 14:
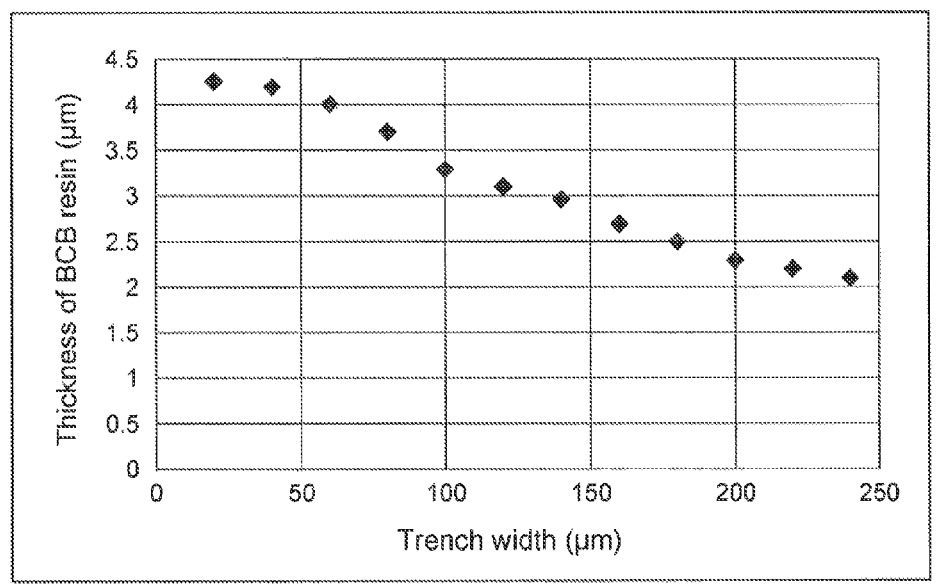
FIG. 14 shows the correlation between a trench width and the thickness of the BCB resin layer on the semiconductor mesa.

The substrate product including the InP substrate, the base waveguide structure, the SiN protective layer, and the BCB resin layer is cleaved through a shot in the wafer center in a direction parallel to the orientation flat (OF). The thickness of the BCB resin layer on the semiconductor mesa and the trench width in each shot are measured, the thickness and the trench width appearing in a section of the cleavage. FIG. 13 shows the in-plane distribution of the thickness of the BCB resin layer on the semiconductor mesa. FIG. 14 shows the correlation between the trench width and the thickness of the BCB resin layer on the semiconductor mesa.

Subsequently, the other of the two epitaxial substrates is processed. A protective layer composed of $SiO_2$ or the like is formed on the entire exposed surface of the epitaxial substrate (refer to FIG. 7B). The protective layer is formed by, for example, a chemical vapor deposition (CVD) method. The thickness of the protective layer is, for example, 200 nm to 400 nm.

Figure 7C:
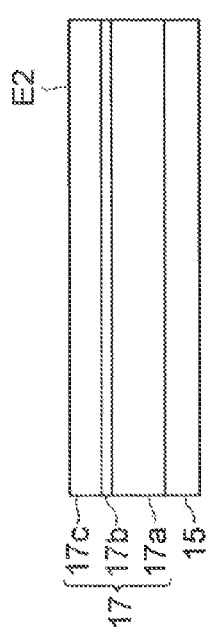

A resin layer composed of a BCB resin is formed on the entire surface of the protective layer by, for example, a spin coating method using a spinner. Herein, the surface of the resin layer is substantially flat (refer to FIG. 7C). The thickness of the resin layer on the semiconductor mesa is, for example, 1.5 μm to 4.5 μm. In this Example, the BCB resin is applied so that the thickness of the BCB resin on the semiconductor mesa is 3 μm.

Figure 7D:
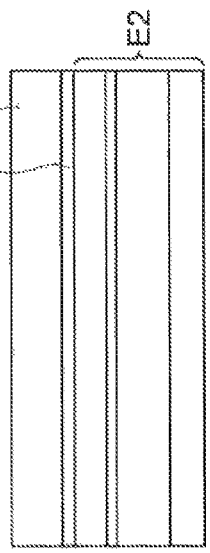

A resist mask is formed on the resin layer made of BCB resin (refer to FIG. 7D). The resist mask has an opening pattern (for example, 33a) located in a region above a waveguide. The opening pattern is formed along the waveguide. Such a resist mask is formed by forming a resist layer on the entire surface of the resin layer and then patterning the resist layer by photolithography.

Figure 7E:
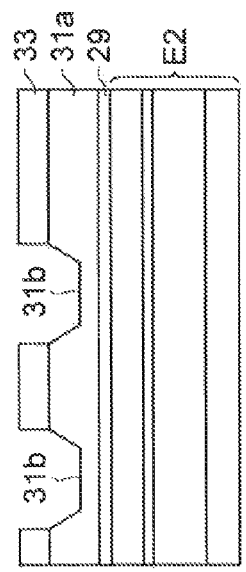
Figure 15:
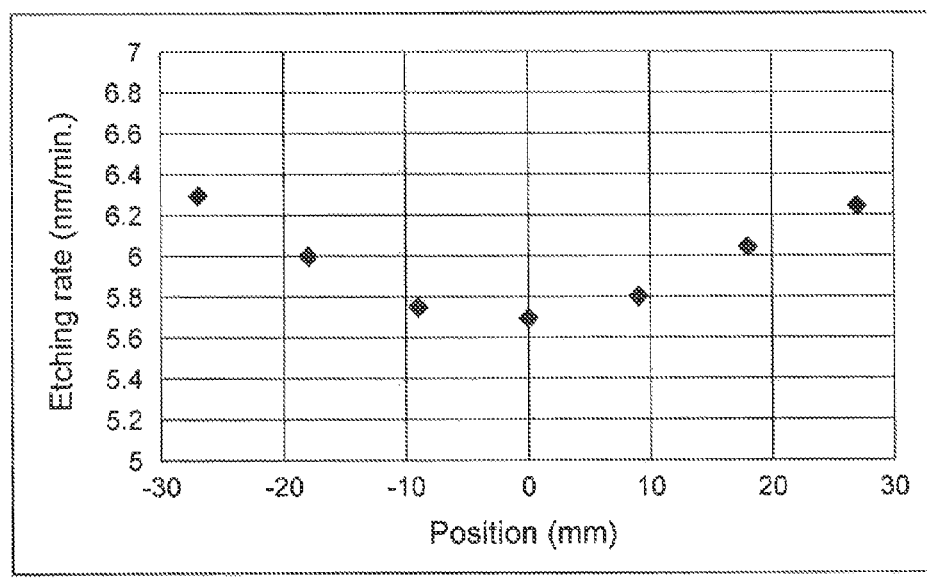
FIG. 15 shows the in-plane distribution of a BCB etching rate in each shot on a substrate product including an InP wafer, a base epitaxial layer structure, an SiN protective layer, and a BCB resin layer, the in-plane distribution extending in a direction parallel to the orientation flat (OF) through a shot near the wafer center.

The resin layer is then etched using the resist mask by a reactive ion etching method that uses an etching gas containing $CF_4$ gas and $O_2$ gas. By etching the resin layer, recesses each having a depth of about 2 μm are formed in the resin layer (refer to FIG. 7E). After the etching process, the resist mask is removed by, for example, a dissolution treatment that uses an organic solvent. The thicknesses of the resin layer (BCB resin layer) in the recesses arranged in the wafer plane are then measured with a step profiler to derive the etching rate in each shot. FIG. 15 shows the in-plane distribution of the etching rate of the BCB resin layer in each shot on the substrate product including the InP substrate, the base epitaxial layer structure, the SiN protective layer, and the BCB resin layer, the in-plane distribution extending in a direction parallel to the orientation flat (OF) through a shot in the wafer center.

Figure 16:
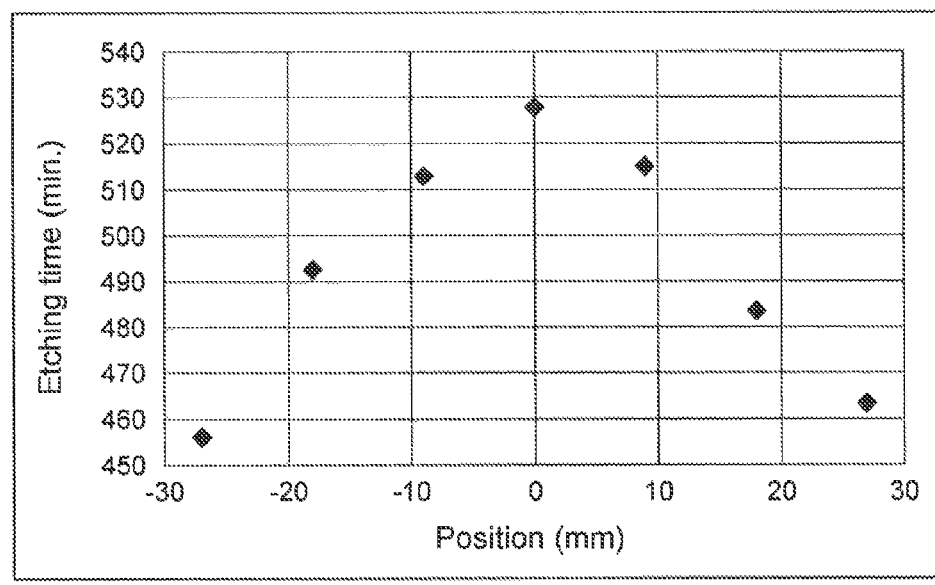
FIG. 16 shows the in-plane distribution of the derived time required to completely etch away the BCB resin layer on the semiconductor mesa.

FIG. 16 shows the in-plane distribution of the time required to completely etch away the BCB resin layer on the semiconductor mesa, the time being derived from the thickness distribution of the BCB resin layer on the semiconductor mesa and the etching rate of the BCB resin layer. When the thickness of the BCB resin layer on the semiconductor mesa that requires the longest time for etching in the wafer plane on the basis of the derived results is smaller or larger than the desired thickness (3 μm in this Example) of the BCB resin layer, the thickness of the BCB resin layer is adjusted to be within a desired range by controlling the number of revolutions of the spinner during applying the BCB resin. In this Example, the desired range of the thickness of the BCB resin layer on the semiconductor mesa is 2.9 μm to 3.1 μm. When necessary, the number of revolutions during applying the BCB resin is controlled so that the thickness of the BCB resin layer is adjusted to be within the desired range. In this case, the above process may be repeatedly performed while adjusting the number of revolutions of the spinner during applying the BCB resin. To achieve the adjustment, samples containing BCB resin layers formed at different numbers of revolutions are preferably prepared in advance.

Figure 17:
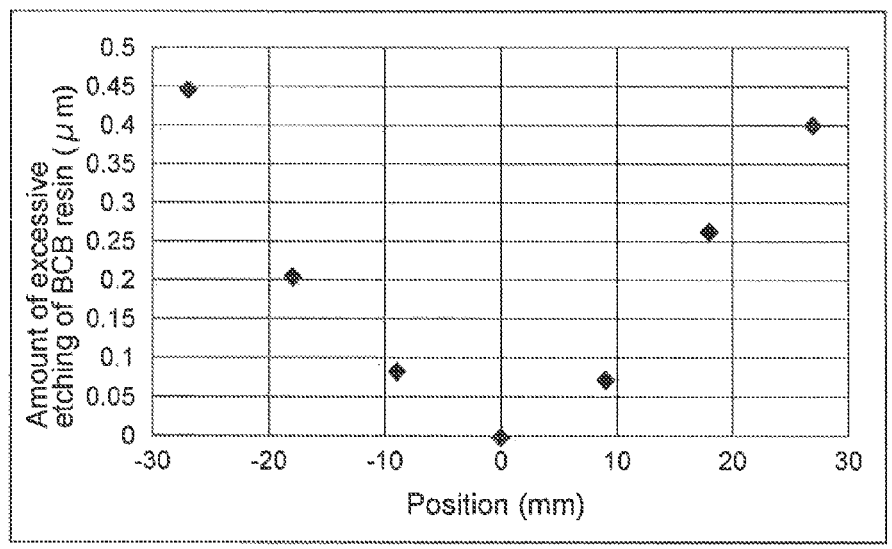
FIG. 17 shows the in-plane distribution of an amount of the excessive etching of the BCB resin in each shot on a substrate product including an InP wafer, a base epitaxial layer structure, an SiN protective layer, and a BCB resin layer, the in-plane distribution extending in a direction parallel to the orientation flat through a shot near the wafer center.

FIG. 16 clarifies the period of time taken until the opening is formed by completely etching away the BCB resin layer on the waveguide. The degree of an excessive etching of the BCB resin on the waveguide in each shot when etching is performed for that period of time can be clarified on the basis of the period of time. FIG. 17 shows the in-plane distribution of an amount of the excessive etching of the BCB resin that is calculated from FIG. 16. FIG. 17 shows the in-plane distribution of the amount of the excessive etching in each shot on the substrate product including the InP wafer, the base epitaxial layer structure, the SiN protective layer, and the BCB resin layer, the in-plane distribution extending in a direction parallel to the orientation flat (OF) through a shot in the wafer center. In an area in which a large amount of the excessive etching of the BCB resin appears, electrodes formed in the subsequent steps may be disconnected. Therefore, the amount of the excessive etching needs to be adjusted to be within an appropriate range. The amount of the excessive etching of the BCB resin is, for example, preferably 150 nm or less and more preferably 100 nm or less.

In this Example, since a single shot has a size of 9 mm×9 mm, the amounts of the excessive etching of the BCB resin in outer two shots on a 3-inch wafer exceed 100 nm. The trench width in the outer shots may be corrected. Referring to FIGS. 13 and 14, in order to set the thickness of the BCB resin layer on the semiconductor mesa to be about 3 μm, the trench width is adjusted to be 100.9 μm in a shot whose distance from the wafer center is 27 mm in consideration of the in-plane distribution of the thickness of the BCB resin layer and the correlation between the trench width and the thickness of the BCB resin layer on the semiconductor mesa. Similarly, the trench width is adjusted to be 111.7 μm in a shot whose distance from the wafer center is 18 mm. The trench width is adjusted to be 116.5 μm in a shot whose distance from the wafer center is −18 mm. The trench width is adjusted to be 97.3 μm in a shot whose distance from the wafer center is −27 mm. To decrease the number of reticles, in areas having a small variation in the thicknesses of the BCB resin layer, such as areas in which the absolute values (radii) of the distances from the wafer center are the same, the average of the trench widths in those areas can be treated as a central value. For example, in the above case, the trench width can be adjusted to be 114.1 μm in the shots whose distances from the wafer center are 18 mm (−18 mm and +18 mm). The trench width can be adjusted to be 99.1 μm in the shots whose distances from the wafer center are 27 mm (−27 mm and +27 mm).

A plurality of reticles having different trench widths are prepared so that the trench width is changed in each shot on the basis of the mapping information. A semiconductor mesa having a trench width corresponding to the corrected mapping information is formed using the reticles. Then, a BCB resin is applied onto the trench structure and an opening is formed in the BCB resin.

Figure 18A:
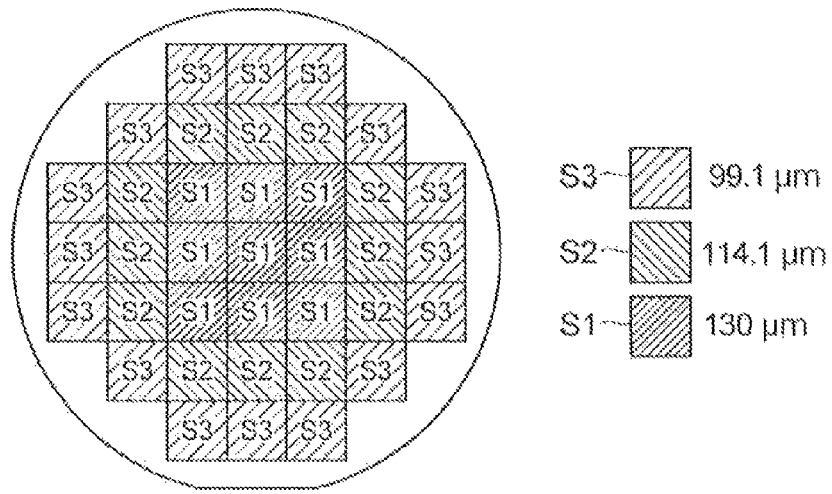
FIGS. 18A and 18B show examples of shot arrangements in Example.
Figure 18B:
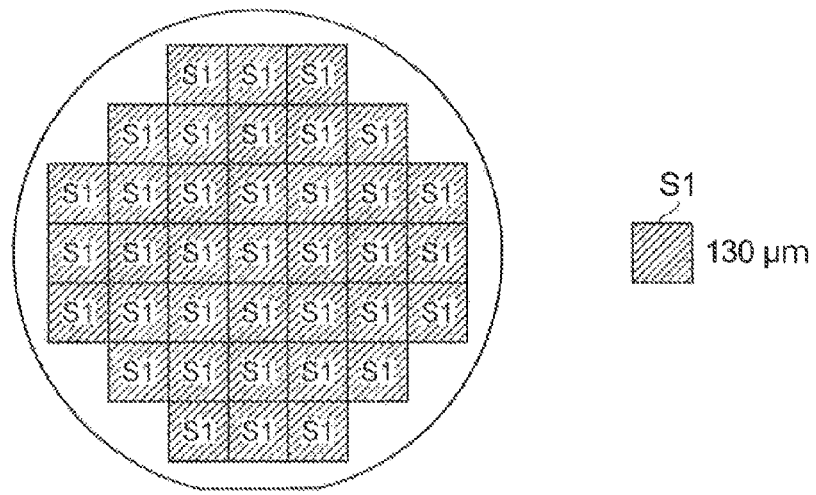

To achieve this, two wafers (semiconductor substrates) are prepared. A first cladding layer, a core layer, and a second cladding layer are formed on each of these semiconductor substrates in that order by a metal-organic vapor phase epitaxy method to make an epitaxial substrate. The epitaxial substrate includes epitaxial layers including the first cladding layer, the core layer, and the second cladding layer grown on the semiconductor substrate. A waveguide is formed by etching the epitaxial layers, and then an insulating layer composed of SiN is formed on the epitaxial substrate. A resist layer is formed on the entire surface of the insulating layer by, for example, a spin coating method, and then a predetermined pattern is formed by photolithography. Herein, a reticle whose trench width is not corrected and a reticle whose trench width is corrected are used for different wafers. In this Example, shots having a size of 9 mm×9 mm are arranged on a 3-inch wafer as shown in FIGS. 18A and 18B. FIG. 18A shows the case of the wafer whose trench width is corrected. In shots located at a radius of 0 mm from the wafer center, a reticle S1 having a trench width of 130 µm is used. In shots located at a radius of 18 mm from the wafer center, a reticle S2 having a trench width of 114.1 µm is used. In shots located at a radius of 27 mm from the wafer center, a reticle S3 having a trench width of 99.1 µm is used. FIG. 18B shows the case of the wafer whose trench width is not corrected. In all shots, the reticle S1 having a trench width of 130 µm is used.

Subsequently, the insulating layer is etched using a resist mask by, for example, a reactive ion etching that uses an etching gas containing $CF_4$ gas. Consequently, the resist pattern is transferred onto the insulating layer. The resist mask is then removed by, for example, an ashing process that uses $O_2$ gas or a dissolution treatment that uses an organic solvent.

The second cladding layer, the core layer, and part of the first cladding layer are etched by, for example, a reactive ion etching method using the patterned insulating layer as a mask. The insulating layer mask is removed using a buffered hydrofluoric acid. Thus, a semiconductor mesa is formed.

Subsequently, part of the exposed first cladding layer is etched until at least the substrate is exposed to form an element isolation mesa according to the following process. An insulating layer composed of SiN and a resist mask are formed, in that order, on the substrate product in which a waveguide has been formed. The insulating layer is then etched using the resist mask as an etching mask by, for example, a reactive ion etching method that uses $CF_4$ gas as an etching gas. As a result of this etching, the pattern formed on the resist mask is transferred onto the insulating layer. The resist mask is then removed by, for example, an ashing process that uses $O_2$ gas or a dissolution treatment that uses an organic solvent. Part of the first cladding layer and substrate is then further etched by, for example, a reactive ion etching method using the patterned insulating layer as an etching mask. Thus, an element isolation mesa is formed. The insulating layer used as the mask is then removed using a buffered hydrofluoric acid.

Subsequently, a protective layer composed of an insulating material such as $SiO_2$ is formed on the entire surfaces of the semiconductor mesa and element isolation mesa. The protective layer is formed by, for example, a chemical vapor deposition method. The thickness of the protective layer is, for example, 200 nm to 400 nm. A benzocyclobutene (BCB) resin layer is then formed on the entire surface of the protective layer by, for example, a spin coating method. The BCB resin layer is formed on upper surfaces of the semiconductor mesa and the element isolation mesa, and side surfaces of the semiconductor mesa and the element isolation mesa. The trench grooves are filled with the BCB resin layer. The BCB resin layer is formed so as to have a substantially flat surface. The thickness of the BCB resin layer on the semiconductor mesa is, for example, 1.5 µm to 4.5 µm. In this Example, the thickness of the BCB resin layer on the semiconductor mesa is controlled to be about 3 µm.

A resist mask is then formed on the BCB resin layer. The resist mask has a pattern for forming an opening in a region above the waveguide. The opening pattern is formed in a belt shape so as to extend along the semiconductor mesa. The resist mask is formed by applying a resist and performing photolithography.

The BCB resin layer is then etched using a resist mask by a reactive ion etching method that uses an etching gas containing $CF_4$ gas and $O_2$ gas to expose the protective layer located below the BCB resin layer. The resist mask is then removed by, for example, a dissolution treatment that uses an organic solvent.

Figure 19:
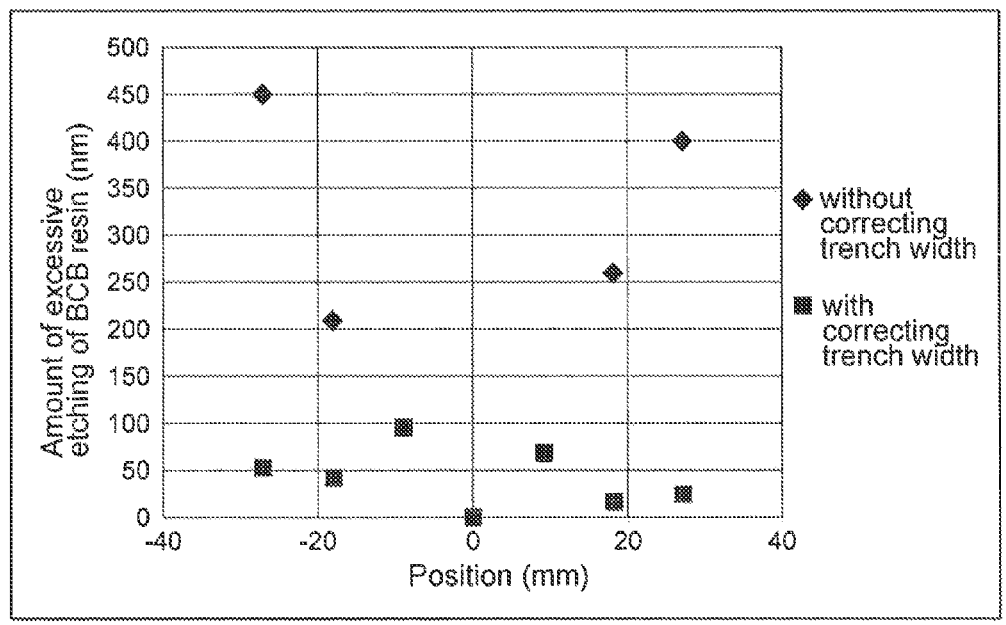
FIG. 19 shows the in-plane distribution of an amount of the excessive etching.

The substrate product is cleaved through a shot in the wafer center in a direction parallel to the OF. The amount of the excessive etching of the BCB resin at the cleavage plane is measured using a scanning electron microscope (SEM). FIG. 19 shows the in-plane distribution of the amount of the excessive etching of the BCB resin. When the trench width is not corrected, the maximum amount of the excessive etching is about 450 nm. When the trench width is corrected, the maximum amount of the excessive etching is about 92 nm. The amount of the excessive etching as a whole wafer is reduced and the variation in the wafer plane is also reduced. The amount of the excessive etching of the BCB resin is reduced to 100 nm or less in the wafer plane, and thus electrodes can be formed without being disconnected in the subsequent steps.

In this Example, a method that uses a stepper has been described, but a mask may be formed by the same method even if a mask aligner is used. Use of a mask aligner provides an advantage in that the trench width can be gradually changed in a single mask.

Figure 20:
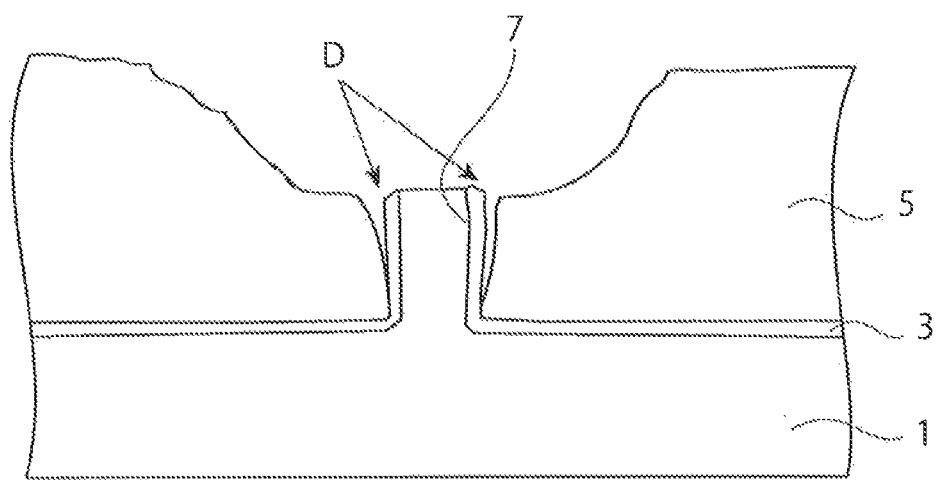
FIG. 20 schematically shows a detachment that may occur at an interface between the BCB resin layer and a protective layer that covers the semiconductor mesa.

In this Example, a dummy semiconductor mesa is not disposed between the semiconductor mesa and the semiconductor terrace. When the interval between the semiconductor mesa and the semiconductor terrace is large, the BCB resin layer may be detached at an interface between the BCB resin layer and the protective layer that covers the semiconductor mesa in the step of forming an opening in the BCB resin layer, as shown in FIG. 20 (see the portion D). In this Example, when the interval between the semiconductor mesa and the semiconductor terrace is 100 µm or more, the partial detachment of the BCB resin layer is observed. Therefore, for example, a dummy semiconductor mesa having a width of 3 µm is disposed at substantially the center between the semiconductor mesa and the semiconductor terrace. In this case, when an opening is formed in the BCB resin layer, the detachment of the BCB resin layer is not observed. A dummy semiconductor mesa having a width of 3 µm or less does not affect the thickness of the BCB resin layer on the semiconductor mesa. The contact opening for an arm waveguide of a Mach-Zehnder modulator has a belt shape. The production method according to this Example particularly increases the uniformity of the opening having such a shape.

The present invention is not limited to the particular structures disclosed in this embodiment.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for producing an optical semiconductor device, comprising the steps of:

determining a wafer size to make a section arrangement including a plurality of sections in one of which the optical semiconductor device is formed, the optical semiconductor device including a trench and a semiconductor mesa defined by the trench;

obtaining an in-plane distribution of a thickness of a resin layer by measuring a thickness of a resin layer formed on a first arrangement structure on a wafer having the wafer size, the first arrangement structure including a plurality of mesas defined by trenches having a predetermined trench width;

obtaining a correlation between a thickness of a resin layer and a trench width by measuring a thickness of a resin layer formed on a second arrangement structure on a wafer having the wafer size, the second arrangement structure including a plurality of mesas defined by trenches having trench widths different from each other;

forming a trench width map on a wafer having the wafer size by determining a trench width of the trench in the optical semiconductor device by using the in-plane distribution of the thickness and the correlation between the thickness of the resin layer and the trench width;

preparing an epitaxial substrate by forming a stacked semiconductor layer on a substrate having the wafer size, the substrate having the section arrangement including the plurality of sections;

forming, on the epitaxial substrate, a mask including a pattern for the semiconductor mesa and for the trench of the optical semiconductor device, the trench of the device having a trench width based on the trench width map;

forming a trench structure including the semiconductor mesa and the trench by etching the stacked semiconductor layer using the mask;

forming a resin layer on the trench structure, the resin layer being formed on an upper surface and a side surface of the semiconductor mesa; and forming an opening on the semiconductor mesa by etching the resin layer, the upper surface of the semiconductor mesa being exposed through the opening.

2. The method for producing an optical semiconductor device according to claim 1, further comprising a step of:

obtaining an in-plane distribution of the etching rate by measuring an etching rate of a resin layer formed on a wafer having the wafer size, wherein, in the step of forming the trench width map, the trench width of the trench in the optical semiconductor device is determined using the in-plane distribution of the thickness, the in-plane distribution of the etching rate, and the correlation between the thickness of the resin layer and the trench width.

3. The method for producing an optical semiconductor device according to claim 1, wherein the resin layer is composed of a benzocyclobutene resin.

4. The method for producing an optical semiconductor device according to claim 1, further comprising a step of:

after forming the trench structure and before forming the resin layer on the trench structure, forming an insulating layer on the trench structure, wherein, in the step of forming the opening on the semiconductor mesa, after etching the resin layer, the insulating layer is etched until the upper surface of the semiconductor mesa is exposed through the opening.

5. The method for producing an optical semiconductor device according to claim 4, wherein the insulating layer is composed of silicon dioxide, silicon oxynitride, or silicon nitride.

6. The method for producing an optical semiconductor device according to claim 1, wherein the trench structure includes a trench defined by the semiconductor mesa and a semiconductor terrace;

the trench defined by the semiconductor mesa and the semiconductor terrace has the trench width based on the trench width map; and the trench width in one of the sections in the section arrangement of the substrate is different from the trench width in another one of the sections in the section arrangement of the substrate.

7. The method for producing an optical semiconductor device according to claim 1, wherein the optical semiconductor device includes a Mach-Zehnder modulator having a first waveguide including a first semiconductor mesa and a second waveguide including a second semiconductor mesa, the first and second waveguides extending in a first direction.

8. The method for producing an optical semiconductor device according to claim 7, wherein the trench structure includes a first semiconductor terrace, a first trench, the first semiconductor mesa, a second trench, the second semiconductor mesa, a third trench, and a second semiconductor terrace that are arranged in that order in a second direction intersecting the first direction;

the first trench is defined by the first semiconductor terrace and the first semiconductor mesa;

the third trench is defined by the second semiconductor mesa and the second semiconductor terrace;

the first and third trenches have the trench width based on the trench width map; and the trench width of the first and third trenches in one of the sections in the section arrangement of the substrate is different from the trench width of the first and third trenches in another one of the sections in the section arrangement of the substrate.

9. The method for producing an optical semiconductor device according to claim 1, wherein the mask has a pattern for forming a dummy semiconductor mesa in the trench;

the trench structure includes the dummy semiconductor mesa in the trench;

the dummy semiconductor mesa extends in a direction in which the semiconductor mesa extends; and the width of the dummy semiconductor mesa is smaller than the width of the semiconductor mesa.

10. The method for producing an optical semiconductor device according to claim 9, wherein the dummy semiconductor mesa and the semiconductor mesa have an interval of 3 μm or more.

11. The method for producing an optical semiconductor device according to claim 1, wherein, in the step of forming the mask on the epitaxial substrate, the mask is made by performing exposure using a single photomask that includes the pattern of the semiconductor mesa and the trench having the trench width based on the trench width map.

12. The method for producing an optical semiconductor device according to claim 1, wherein, in the step of forming the mask on the epitaxial substrate, the mask is made by performing exposure using a plurality of photomasks that include the pattern of the semiconductor mesa and the trench having the trench width based on the trench width map.

13. The method for producing an optical semiconductor device according to claim 1, wherein, in the step of forming the resin layer on the trench structure, a resin is applied onto the trench structure by a spin coating method to form the resin layer having a predetermined thickness, and the thickness of the resin layer is adjusted while controlling a number of revolutions of a spinner during applying the resin.

14. The method for producing an optical semiconductor device according to claim 1, further comprising a step of:

after forming the opening on the semiconductor mesa, forming an electrode in the opening, the electrode being in contact with the upper surface of the semiconductor mesa.

* * * * *